United States Patent
Shrivastava et al.

(10) Patent No.: US 10,205,439 B2
(45) Date of Patent: *Feb. 12, 2019

(54) DIGITAL STEP ATTENUATOR WITH REDUCED RELATIVE PHASE ERROR

(71) Applicant: pSemi Corporation, San Diego, CA (US)

(72) Inventors: Ravindranath Shrivastava, San Diego, CA (US); Kristian Madsen, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 167 days.

This patent is subject to a terminal disclaimer.

(21) Appl. No.: 15/256,450

(22) Filed: Sep. 2, 2016

(65) Prior Publication Data
US 2016/0373086 A1    Dec. 22, 2016

Related U.S. Application Data

(63) Continuation of application No. 14/538,694, filed on Nov. 11, 2014, now Pat. No. 9,444,432.

(51) Int. Cl.
*H03H 11/24*      (2006.01)
*H01F 38/14*      (2006.01)

(52) U.S. Cl.
CPC ......... *H03H 11/245* (2013.01); *H01F 38/14* (2013.01)

(58) Field of Classification Search
CPC .............................. H03H 11/24; H03H 11/245
See application file for complete search history.

(56) References Cited

U.S. PATENT DOCUMENTS

| | | | |
|---|---|---|---|
| 6,300,814 B1 * | 10/2001 | Takahashi | H03H 11/245 327/308 |
| 6,828,873 B2 | 12/2004 | Ludwig et al. | |
| 8,022,785 B2 * | 9/2011 | Zelenz | H03H 7/0115 333/185 |
| 8,514,007 B1 | 8/2013 | Ahmed et al. | |
| 8,653,890 B1 | 2/2014 | Ahmed et al. | |
| 8,736,347 B2 | 5/2014 | Ahmed et al. | |
| 8,816,767 B2 | 8/2014 | Ahmed et al. | |
| 9,100,046 B2 | 8/2015 | Granger-Jones | |

(Continued)

OTHER PUBLICATIONS

Nguyen, Hai L., Office Action received from the USPTO dated Nov. 13, 2015 for U.S. Appl. No. 14/538,694, 6 pgs.

(Continued)

*Primary Examiner* — Hai L Nguyen
(74) *Attorney, Agent, or Firm* — Jaquez Land Greenhaus LLP; Martin J. Jaquez, Esq.; Bruce W. Greenhaus, Esq.

(57) ABSTRACT

An apparatus for selectively providing attenuation with minimal relative phase error. A Digital Step Attenuator (DSA) is implemented on an integrated circuit (IC). Each cell of the DSA has a series compensation inductance that is introduced between an input to the cell and a resistor on the cell. The series compensation inductance allows the location of a pole present in the transfer function of the cell to be manipulated. By controlling the location of the pole in the transfer function of the DSA, the relative phase error of the cell can be controlled. In another disclosed embodiment, the capacitance of a shunt compensation capacitor is increased to manipulate a pole in the transfer function of a DSA cell.

21 Claims, 19 Drawing Sheets

(56) References Cited

U.S. PATENT DOCUMENTS

| | | |
|---|---|---|
| 9,444,432 B2 | 9/2016 | Shrivastava et al. |
| 10,003,322 B2 * | 6/2018 | Lam .................... H03H 11/245 |
| 2013/0120061 A1 | 5/2013 | van der Zanden et al. |
| 2014/0077874 A1 | 3/2014 | Ahmed et al. |
| 2014/0253248 A1 | 9/2014 | Ahmed et al. |
| 2016/0134259 A1 | 5/2016 | Shrivastava et al. |

OTHER PUBLICATIONS

Nguyen, Hai L., Office Action received from the USPTO dated Feb. 11, 2016 for U.S. Appl. No. 14/538,694, 11 pgs.

Nguyen, Hai L., Notice of Allowance received from the USPTO dated May 11, 2016 for U.S. Appl. No. 14/538,694, 8 pgs.

Shrivastava, et al., Response to Restriction Requirement filed in the USPTO dated Jan. 6, 2016 for U.S. Appl. No. 14/538,694, 15 pgs.

Shrivastava, et al., Response filed in the USPTO dated Apr. 26, 2016 for U.S. Appl. No. 14/538,694, 15 pgs.

Poos, John W., Office Action received from the USPTO dated Dec. 7, 2018 for U.S. Appl. No. 16/030,567, 15 pgs.

* cited by examiner

DIGITAL STEP ATTENUATOR WITH REDUCED RELATIVE PHASE ERROR

CROSS REFERENCES TO RELATED APPLICATIONS—CLAIM OF PRIORITY

This application is a continuation of co-pending U.S. application Ser. No. 14/538,694 filed Nov. 11, 2014, entitled "Digital Step Attenuator with Reduced Relative Phase Error", the disclosure of which is incorporated herein by reference in its entirety.

TECHNICAL FIELD

The disclosed method and apparatus relates to attenuators and more particularly, to digital step attenuators.

BACKGROUND

Within the communications industry, and in other industries more generally, it is desirable to adjustably attenuate a radio frequency (RF) signal without imparting a change to the phase of the attenuated signal. In particular, this is the case when RF signals are combined, for example, with signals at the output of a Doherty Amplifier circuit. Another example is when signals are combined to form a beam within a phased array system, such as might be used for either communications or radar. In the case of a Doherty Amplifier circuit, in order to properly combine the outputs of the two amplifiers that form a Doherty pair, the relative power from each amplifier must be adjusted. Such amplitude adjustment may be made using a digital step attenuator (DSA) at the output of one of the amplifiers before combining the outputs of each amplifier of the pair. When combining the outputs of the two amplifiers, it is important to control the relative phase of each signal to ensure that the signals combine as desired to meet a desired specification. In particular, it is typically important to maintain the same phase relationship between the two signals as changes are made to the amount of attenuation provided to the signals.

If the relative phase of a signal that is attenuated by the DSA changes when there are changes in the amount of attenuation applied, distortion typically occurs. For example, when combining the output of a Doherty pair, the output of a first amplifier is attenuated in order to properly set the relative amplitude level with respect to output of a second amplifier. If such changes in the amplitude cause changes in the relative phase of the signals being combined, QAM symbols modulated on the signal will be distorted making the signals difficult to demodulate.

FIG. 1 shows a digital step attenuator (DSA) 100 that might be used in a Doherty amplifier or other such circuit. The DSA 100 comprises several DSA cells 102-108. A signal is applied to the input 110 of the first cell 102. The cells 102-108 are coupled in series. Each cell 102-108 is in either a reference state or an attenuation state. In the reference state, the attenuation through the cell 102-108 is minimal. When a cell is in the attenuation state, the cell 102-108 will attenuate the signal by a predetermined amount. In one example, a "thermometer" configuration provides an equal amount of attenuation for each cell that is in the attenuation state. In this example, the total attenuation is equal to the sum of the attenuation provided by each of the cells that is in the attenuation state. In other thermometer configurations, different amounts of attenuation may be provided by each cell. Alternatively, in a "binary" controlled DSA with four cells and attenuation steps of n dB, the first cell 102 has an attenuation that is $(2^0)$ n dB, the second cell 104 has an attenuation equal to $(2^1)$ n dB, the third cell 106 has an attenuation of $(2^2)$ n dB, and the fourth cell 108 has an attenuation of $(2^3)$ n dB. Therefore, by selectively setting each cell to either the attenuation state or the reference state, a range of attenuation from the reference state to $(2^4-1)$ n dB in n dB steps can be provided by the DSA 100.

FIG. 2 shows an integrated circuit (IC) layout of a typical cell (such as the cell 102 shown in FIG. 1). In one example, each cell 102-108 would have the same layout. The layout shows a resistor 202 coupled by a conductive trace 204 to an input pad 206 on one side. The other side of the resistor 202 is coupled by a conductive trace 208 to an output pad 210. A field effect transistor (FET) 214 is used as a control switch to control the state of cell 102. The FET 214 is used to place the cell 102 in either an attenuation state or a reference state. The source 212 of the FET 214 is coupled to the input pad 206. The drain 216 of the FET 214 is coupled to the output pad 210. When the FET 214 is turned on (i.e., conducts with minimal resistance from source 212 to drain 216), the cell 102 is in the reference state. When the FET 214 is turned off (i.e., has minimal conduction from source 212 to drain 216), the cell 102 is in the attenuation state.

A first capacitance, such as a capacitor 218 is coupled between the source 212 and a common potential, such as ground. Likewise, a second capacitance, such as capacitor 220 is coupled between the drain 216 and a common potential, such as ground. The capacitors 218, 220 provide compensation for leakage through the parasitic capacitance through the FET 214. That is, at higher frequencies, signals will see lower impedance through the FET 214 than they do at relatively lower frequencies. Since it is desirable to maintain a flat amplitude response over the frequency band of interest, providing shunting capacitors 218, 220 will compensate for the reduced resistance through the FET 214 at relatively higher frequencies and thus allow for a relatively flat frequency response over the frequency band of interest.

However, while the amplitude frequency response is flat over the desired frequency range, the relative phase error is not. That is, as each cell 102-108 of the DSA 100 is switched from the reference state to the attenuation state in order to provide the desired attenuation, the relative phase of the output with respect to the input changes. The difference between the phase of the output when all cells are in the reference state and the phase of the output when a particular attenuation setting is selected is referred to herein as "relative phase error" for that particular attenuation setting.

FIG. 3 shows relative phase error with respect to frequency for several different attenuation settings of the DSA 100. The curves 302, 304, 306, 308 show the amount of phase error as a function of frequency for each of four different attenuation settings. For example, the curve 302 shows the relationship between phase error and frequency for an attenuation setting of approximately 15 dB. The curve 304 shows the relationship between phase error and frequency for an attenuation setting of approximately 10 dB. The curve 306 shows the relationship between phase error and frequency for an attenuation setting of approximately 5 dB. The curve 308 shows the relationship between phase error and frequency for an attenuation setting of approximately 0.5 dB.

In at least some applications in which a DSA 100 is used, it is desirable that the phase error not change when a particular DSA cell 102-108 is switched from the reference state to the attenuation state (i.e., when the level of attenuation for the DSA 100 changes). It is also desirable to maintain a relatively flat relative phase error over the desired operating frequency range. As noted above, distortion will occur in symbols modulated on an RF signal using quadrature amplitude modulation (QAM) if there is a significant difference in the relative phase error for signals that run through a DSA at one attenuation level with respect to another attenuation level. Such distortion can result in errors when demodulating the symbols (i.e., when trying to recover the information modulated on the signals). Furthermore, changes in the phase error over frequency at the same attenuation level are undesirable as well.

Accordingly, there is presently a desire for a DSA having cells with reduced relative phase error over a desired operating frequency range of interest and over a desired range of attenuation settings.

SUMMARY

Various embodiments of a digital step attenuator (DSA) having cells with reduced relative phase error are disclosed. In one disclosed embodiment, a DSA is implemented on an integrated circuit (IC). Each cell of the DSA has a compensation inductance introduced in series between an input to the cell and a resistor on the cell. The series compensation inductance allows the location of a pole present in the transfer function of the cell to be manipulated. By controlling the location of the pole in the transfer function of the DSA, the relative phase error of the cell can be controlled. In particular the relative phase error of the cells of a DSA can be reduced over a desired operating frequency range, thus reducing the overall relative phase error of the DSA for each attenuation setting over the full attenuation range of the DSA. In one embodiment, the series compensation inductance is increased by extending the length of the conductor used to connect an input pad to a resistor that provides the primary source of resistance when the DSA cell is in the attenuation state.

In another disclosed embodiment, the capacitance of a shunt compensation capacitor is increased to manipulate a pole in the transfer function of a DSA cell. Similar to the manipulation of the pole by adjusting the series compensation inductance, manipulation of the pole by adjusting the value of the shunt compensation capacitor provides control over the amount of relative phase error introduced by the cell. However, manipulating the pole in the transfer function to reduce the relative phase error by adjusting the shunt compensation capacitor has the disadvantage of causing the amplitude frequency response to drop off at higher frequencies. Thus, there is a trade-off between improving the relative phase error and maintaining a flat amplitude frequency response. In one embodiment, the capacitor adjusts for both high frequency leakage through a field effect transistor (FET) within the cell to establish a relatively flat amplitude frequency response. However, if the capacitance is increased to move a pole within the transfer function to reduce the relative phase error, the amplitude frequency response will suffer. Accordingly, manipulating the amount of capacitance to move the pole reduces the relative phase error of the cell, but at the expense of causing a slight roll-off of the amplitude of the signal at high frequency.

In yet another disclosed embodiment, both a series compensation inductance and a shunt compensation capacitor are adjusted in order to improve the relative phase error. The combination of the adjusting the series compensation inductance and the adjusting the shunt compensation capacitance provides a means by which the relative phase error of the DSA cell can be controlled over a desired frequency range of operation.

BRIEF DESCRIPTION OF THE DRAWINGS

The disclosed apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

Figure 4:
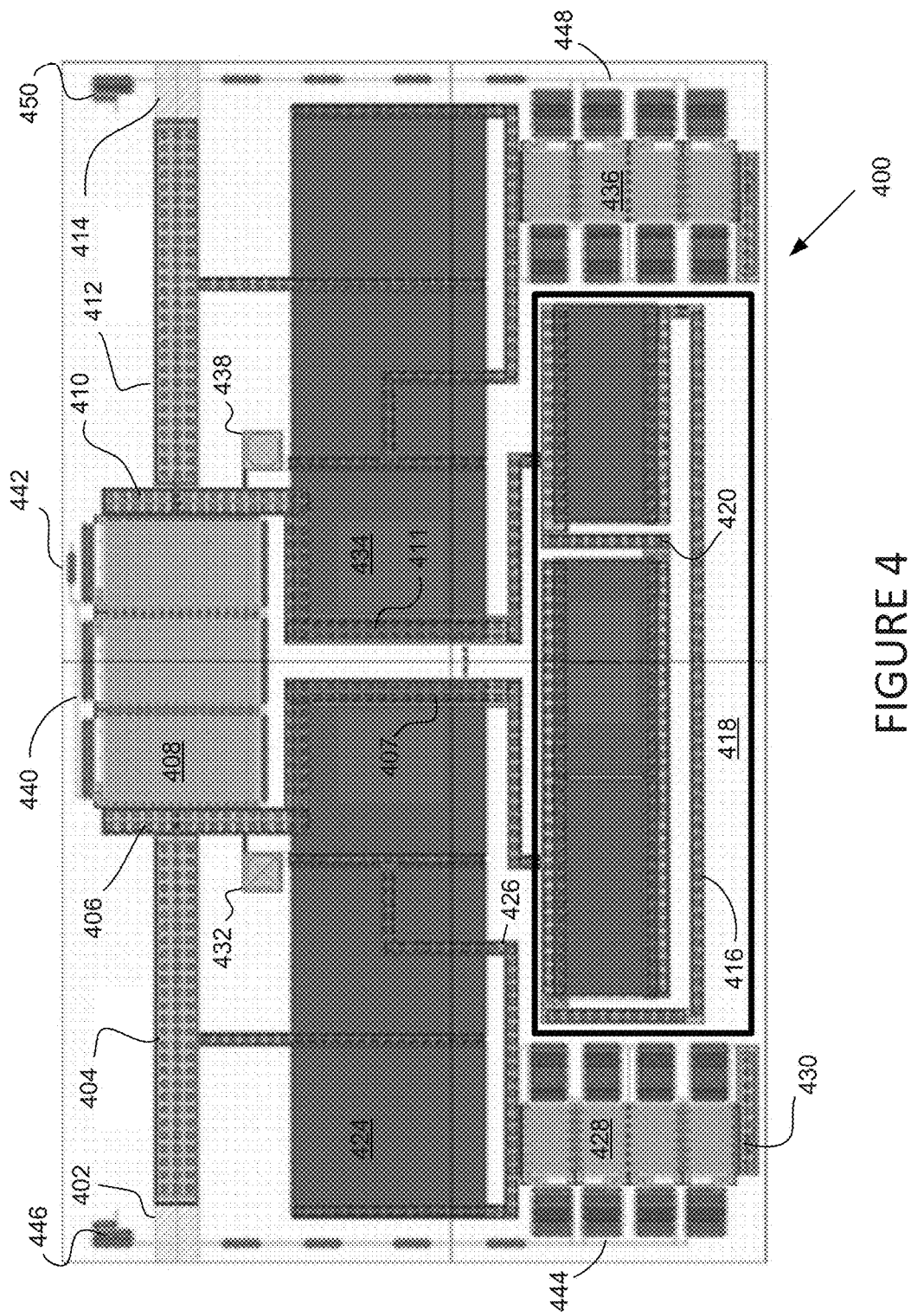
FIG. 4 shows a layout of a DSA cell in accordance with one embodiment of the presently disclosed apparatus in which a series compensating inductance reduces the relative phase error of the cell.
Figure 5:
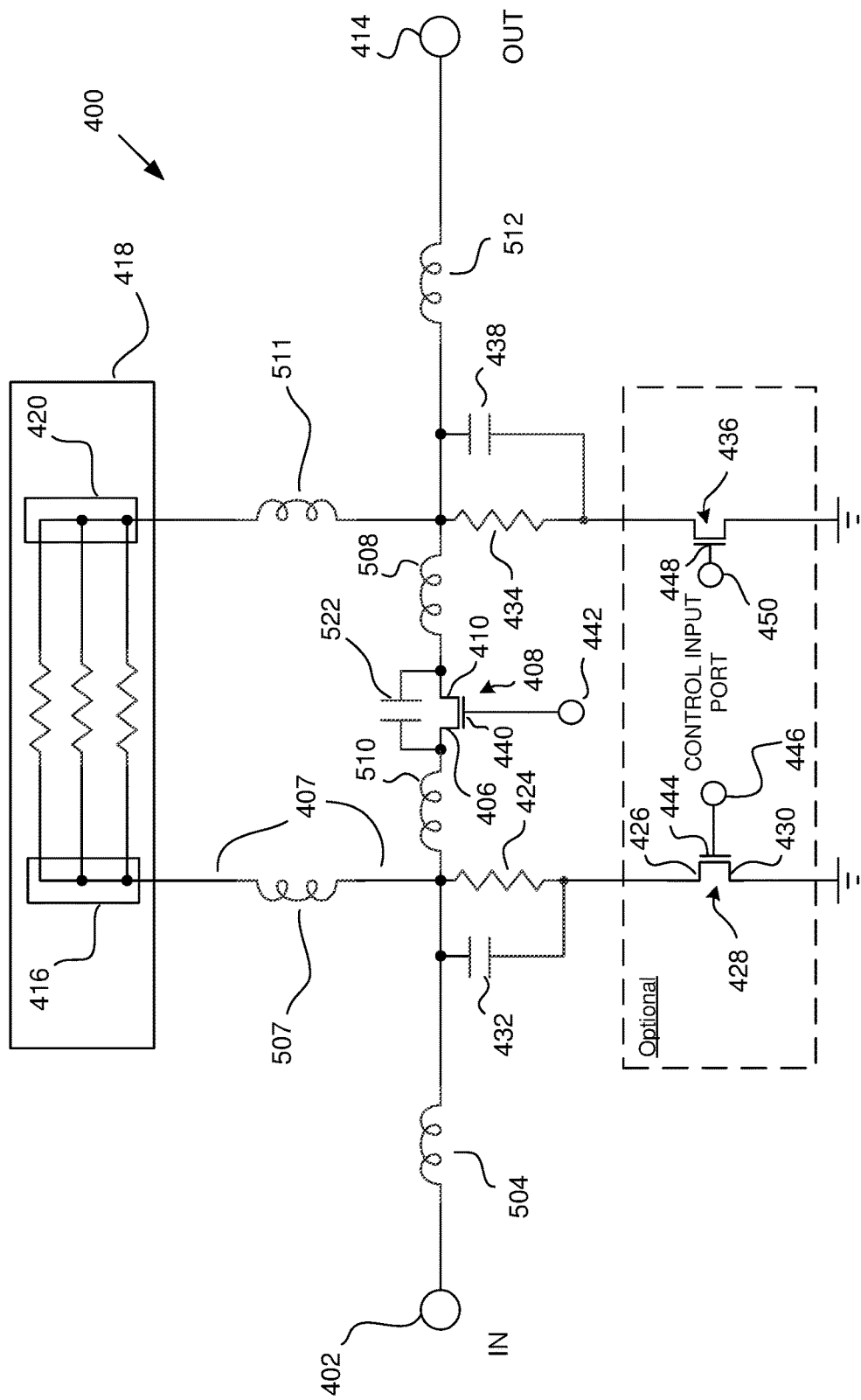
FIG. 5 is an electrical schematic of a DSA cell in accordance with one embodiment of the disclosed apparatus.

FIG. 4 shows an integrated circuit (IC) layout of a digital step attenuator (DSA) cell 400 in accordance with one embodiment of the disclosed apparatus. FIG. 5 is an electrical schematic of the cell 400. Components of the layout shown in FIG. 4 have the same reference number as the schematic symbol representing the component in FIG. 5. The operation of the cell 400 is described in more detail below after a brief description of the structure of the cell 400.

As shown in FIGS. 4 and 5, the cell 400 has an input port that allows the cell 400 to receive an input from an external source. In one embodiment, the input port is an input pad 402. The input pad 402 is coupled to a conductive trace 404. The conductive trace 404 has an inductance that is modeled with a lumped element inductor 504 shown in the schematic of FIG. 5. However, it will be understood by those skilled in the art that the inductance 504 is distributed over the length of the conductive trace 404. In an alternative embodiment, additional inductance can be added by increasing the length of the conductive trace 404 or adding an additional inductive structure to the layout.

The trace 404 couples the input pad 402 to an input terminal 406 of a switch element 408. The switch element 408 also has an output terminal 410 and a control terminal 440. In accordance with one embodiment of the disclosed apparatus, the switch element 408 is a field effect transistor (FET). The input terminal 406 is the source of the FET 408. The drain of the FET 408 is the output terminal 410. The gate of the FET 408 is the control terminal 440. The drain 410 is coupled by another conductive trace 412 to an output port 414 that allows the cell 400 to provide an output to an external load (not shown). In one embodiment, this port 414 is an output pad. In one embodiment, the output load comprises another DSA cell 400. A first inductive coupling, such as a conductive trace 407, also couples the source 406 to a first terminal 416 of a resistive element. In one embodiment, the resistive element is a set of series resistors 418. The conductive trace 407 has a distributed inductance over the length of the trace 407 that is modeled in the schematic of FIG. 5 as a lumped element inductor 507. In addition, there is an inductance LFET present between the source of the FET 408 and the conductive trace 407 that is modeled as a lumped inductance 508. This inductance is due to the trace 406. By making the trace 406 relatively broad, the amount of inductance is reduced, which helps to improve the relative phase error performance. Similarly, there is an inductance LFET present between the drain of the FET 408 and the conductive trace 507 that is modeled in FIG. 5 as inductance 510. In one embodiment of the presently disclosed method and apparatus, LFET is negligible. The set of series resistors 418 has a second terminal 420 that is coupled to the drain 410 of the FET 408 by a second inductive coupling, such as a conductive trace 411. The conductive trace 411 has a distributed inductance over the length of the trace 411 that is modeled in the schematic of FIG. 5 as a lumped element inductor 511. In an alternative embodiment, the resistive element 418 is a single resistor rather than the set of series resistors shown in FIG. 5. In an alternative embodiment, the resistive element 418 is any component that provides the desired resistance between the input pad 402 and the output pad 414.

A lumped element inductance 507 is modeled to indicate the inductance distributed along the length of the conductive trace 412. The "off" capacitance of the FET 408 is modeled in the schematic of FIG. 5 by a capacitance, such as capacitor 522. Accordingly, there is no correlating structure shown in the layout of FIG. 4 for the capacitor 522 shown in FIG. 5 (i.e., the correlating structure is the FET 408).

In accordance with one embodiment of the disclosed apparatus, a second resistive element, such as a resistor 424, is coupled between the source 406 of the FET 408 and the source 426 of a switch element, such as a second FET 428. A first of two compensation capacitances, such as capacitor 432 shunts the resistor 424. The drain 430 of the second FET 428 is coupled to a common potential (e.g., ground). The layout of FIG. 4 shows the FET 428 as comprising four FETs stacked together. However, for the sake of simplicity, a single FET 428 is shown in the schematic of FIG. 5. In an alternative embodiment, any structure can be used that selectively turns on and off the flow of current from the resistor 424 to ground, including a single FET, a bipolar transistor or any other means for selectively substantially increasing and decreasing the resistance between the resistor 424 and ground. A similar arrangement (i.e., a resistor 434, a shunt compensation capacitance, such as capacitor 438 and a third switch element, such as a FET 436) is coupled between the drain 410 of the FET 408 and ground. In an alternative embodiment, the FETs 428, 436 are not present. Therefore, in this embodiment, the parallel resistor 424 and capacitor 432 are coupled directly between the source 406 of the FET 408 and ground. Similarly, the parallel resistor 434 and capacitor 438 are coupled directly between the drain 410 of the FET 408 and ground.

The gate 440 of the FET 408 is coupled to a first control input port 442. The gate 444 of the FET 428 is coupled to a second control input port 446. The gate 448 of the FET 436 is coupled to third a control input port 450.

Figure 1:
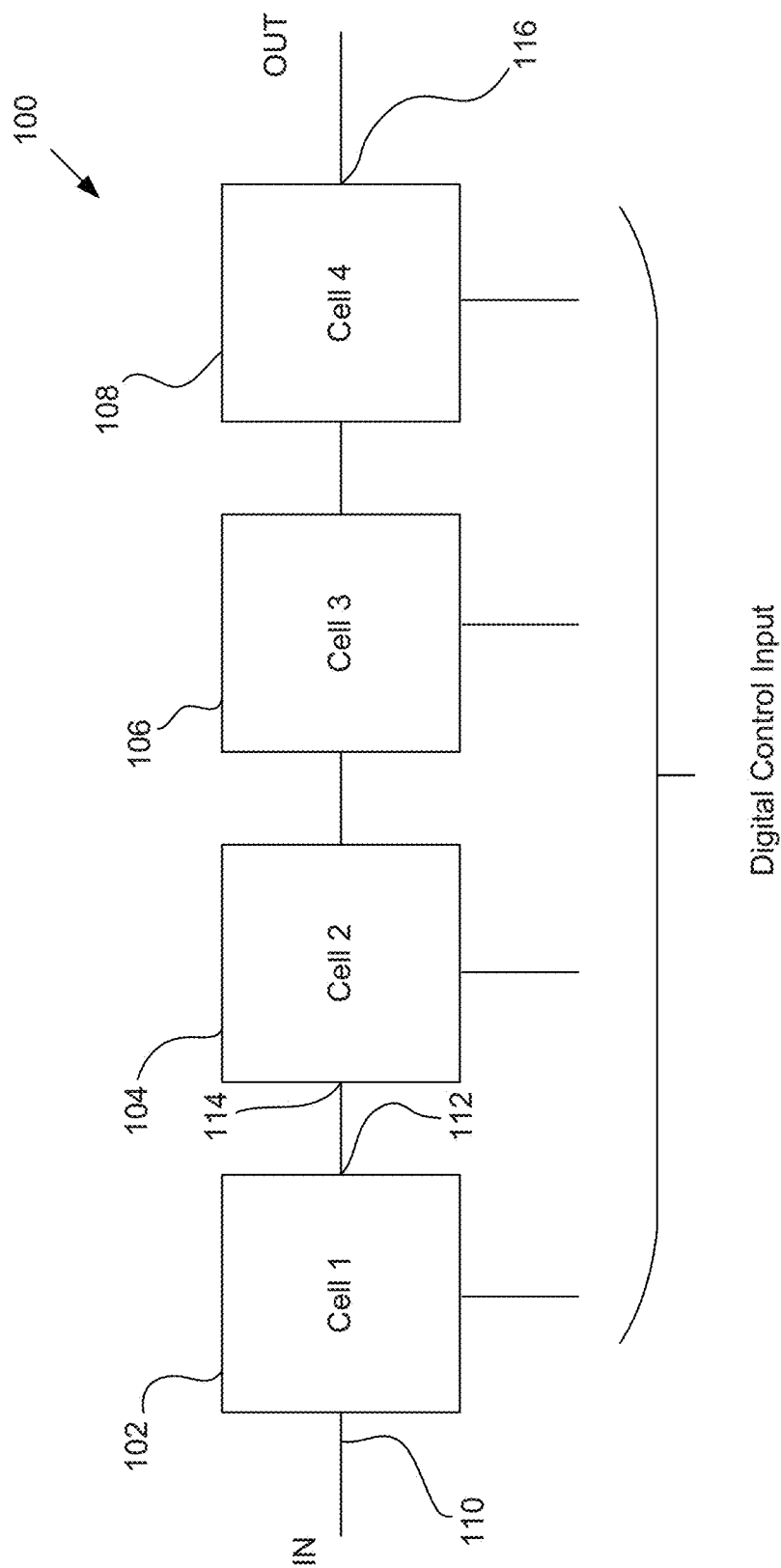
FIG. 1 is a simplified block diagram of a digital step attenuator (DSA).

The operation of a DSA in accordance with embodiments of the presently disclosed apparatus will now be described in more detail. As can be seen from FIG. 1, a DSA 100 is generally comprised of several DSA cells 102, 104, 106, 108. An attenuator in accordance with the embodiments of the disclosed apparatus is comprised of DSA cells such as the DSA cell 400 shown in FIGS. 4 and 5. Accordingly, several such DSA cells 400 are coupled in series to form an attenuator. Referring to FIG. 1, the output 112 of a first DSA cell 102 (i.e., furthest "upstream" DSA cell) is coupled to the input 114 of a next (i.e., adjacent "downstream") DSA cell 104. The input 110 of the first DSA cell 102 forms the input to the attenuator, and the output 116 of the last DSA cell 108 (i.e., furthest downstream DSA cell) forms the output of the attenuator (refer to FIG. 1). The input of each DSA cell, with the exception of the furthest upstream DSA cell, is coupled to the output of the adjacent upstream DSA cell. Accordingly, as shown in FIG. 1, each of the DSA cells are strung together in series. However, in an alternative embodiment, other configurations of DSA cells can be used to form a DSA, including one or more DSA cells in parallel.

Each DSA cell 400 operates essentially identically, as follows. A signal to be selectively attenuated is applied to the input pad 402. The three FETs 408, 428, 436 each function as a switch to either allow current to flow from source to drain or to impede the flow of current. In an alternative embodiment, current can flow from drain to source. Each FET 408, 428, 436 is turned on or off by applying a control signal to the control input port 442, 446, 450 coupled to the gate of the associated FET 408, 428, 436. The impedance matching and compensation circuits formed from the shunt resistor 424 and shunt resistor 434 can be removed from the circuit of the DSA cell 400 by turning off the FETs 428, 436.

The DSA cell 400 has two operational states. The first operational state is a "reference" state in which the FET 408 is turned on. The second operational state is an "attenuation" state in which the FET 408 is turned off. In the reference state, the resistance $R_{on}$ from source 406 to drain 410 through the FET 408 is minimal.

Figure 6:
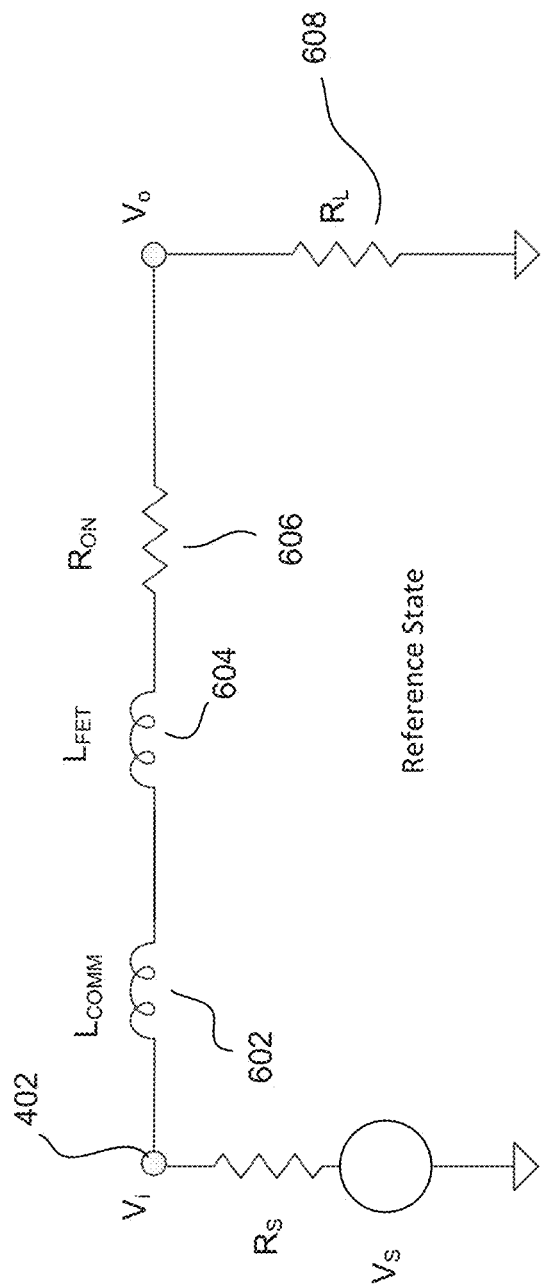
FIG. 6 is a simplified equivalent circuit of a DSA cell configured in a reference state in accordance with one embodiment of the presently disclosed apparatus.

FIG. 6 is an electrical schematic of an equivalent circuit that models the operation of the cell 400 when the cell 400 is in the reference state. A signal source $V_s$ having a source resistance $R_s$ provides an input voltage $V_i$ to the input pad 402. In one embodiment, the signal source is another DSA cell 400. An inductor 602 represents an inductance that is common to both the reference state and the attenuation state. In the embodiment shown in the layout of FIG. 4, the common inductance comes from the distributed inductance 504 along the conductive trace 404 between the input port 402 and the source 406 of the FET 408. In the schematic show in FIG. 6, an inductor 604 represents the inductance of the FET 408 from source to drain. The resistance $R_{on}$ of the FET 408 is modeled as a resistor 606. The load 608 has a resistance that is represented by the resistor $R_L$.

From the equivalent circuit of FIG. 6, it can be seen that the phase $\emptyset_{REF\_STATE}$ of the cell 400 from input $V_i$ to output $V_o$ in the reference state is:

$$\emptyset_{REF\_STATE} = -\tan^{-1}\left[\frac{(L_{COMM} + L_{FET})\omega}{R_{ON} + R_L}\right] \quad \text{Eq. 1}$$

Figure 7:
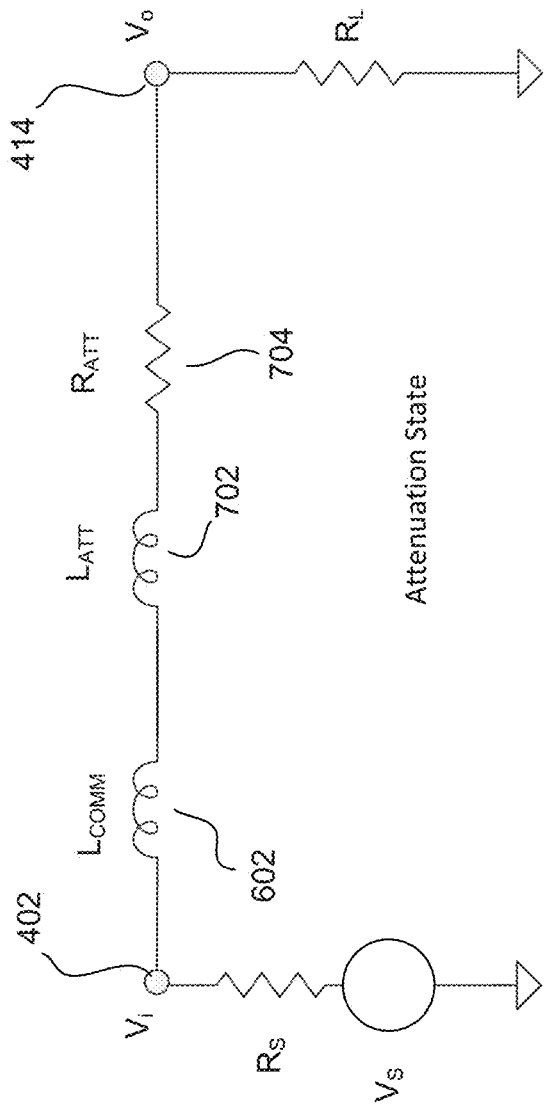
FIG. 7 is a simplified equivalent circuit of a DSA cell configured in an attenuation state in accordance with one embodiment of the presently disclosed apparatus in which a series compensation inductor reduces the relative phase error of the cell.

FIG. 7 is an electrical schematic of an equivalent circuit for the cell 400 when the cell 400 is in the attenuation state. When the cell 400 is in the attenuation state, the common inductance 602 remains the same. However, when the FET 408 is turned off, the inductance $L_{FET}$ 604 shown in FIG. 6 is replaced with $L_{ATT}$ 702, which represents the inductance looking into the set of series resistors 418 (see FIGS. 4 and 5). The total resistance $R_{ATT}$ measured from the input pad 402 to the output pad 414 is represented by the resistor 704 in FIG. 7. Accordingly, the phase $\emptyset_{ATT\_STATE}$ of the cell in attenuation state is:

$$\emptyset_{ATT\_STATE} = -\tan^{-1}\left[\frac{(L_{COMM} + L_{ATT})\omega}{R_{ATT} + R_L}\right] \quad \text{Eq. 2}$$

It should be understood that $R_{on}$ is a nominal resistance compared to $R_{ATT}$. That is, the cell 400 is designed to have minimal resistance from input to output in the reference state and a predetermined amount of resistance that is substantially greater in the attenuation state (essentially preventing significant current from flowing through the FET 408). Therefore, it can be seen from equations Eq. 1 and Eq. 2 that:

$$\emptyset_{ATT\_STATE} \gg \emptyset_{REF\_STATE} \quad \text{Eq. 3}$$

The difference between the phase of the cell 400 in the reference state and the phase of the cell 400 in the attenuation state is the relative phase error of the cell 400. In order to reduce the relative phase error of the cell 400, the ratio of $\emptyset_{REF\_STATE}$ to $\emptyset_{ATT\_STATE}$ can be made close to 1, thus significantly reducing the relative phase error of the cell 400.

One way to make this ratio closer to 1 is to increase the value of $L_{ATT}$. In accordance with one embodiment of the disclosed apparatus, one way in which the value of $L_{ATT}$ can be increased is by setting the inductance of the inductive coupling 407, 411. In one embodiment in which the inductive coupling is a conductive trace 407, 411, increasing the length of one or both of the conductive traces 407, 411 that connect the resistance 418 to the input and output ports 402, 414 will increase the inductance of the inductive coupling. Referring to FIG. 4, it can be seen that by placing the resistors 424, 434 between the FET 408 and the resistor 418, the length of the conductive traces 407, 411 is extended, thus providing the desired additional inductance. It will be clear that other layouts are possible to realize alternative embodiments in which the inductance looking into the resistance 418 is increased in the attenuation state while remaining essentially constant for the reference state. Accordingly, the length of the conductive traces is set to select the inductance of the inductive coupling to result in a desired relative phase error in the DSA cell 400.

It can be seen from the layout of FIG. 4 and the schematic of FIG. 5 that a compensation capacitor 432 is coupled from the source 406 of the FET 408 to the source 426 of the FET 428. When the impedance matching resistors and compensation capacitors are in use, the FET 428 conducts with minimal resistance, thus essentially providing a path from the source 406 of the FET 408 through the parallel resistor 424 and capacitor 432 to ground. A second capacitor 438 performs similarly with respect to the drain 410 of the FET 408.

Figure 8:
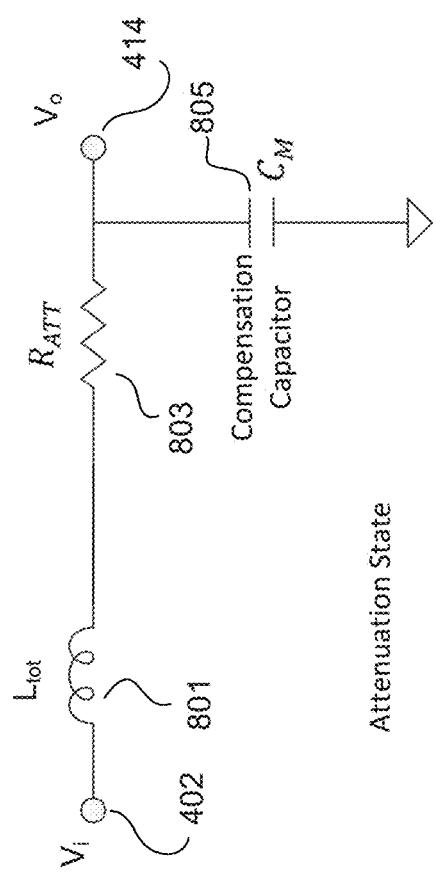
FIG. 8 is a simplified equivalent circuit of a DSA cell configured in an attenuation state in accordance with one embodiment of the presently disclosed apparatus in which a shunt compensation capacitor reduces the relative phase error of the cell.

FIG. 8 is an electrical schematic of an equivalent circuit for the cell 400 in which the effect of the compensation capacitors 432, 438 on the phase of the cell 400 are taken into account when the cell is in the attenuation state. A single inductor 801 is shown to model the total inductance $L_{tot}$ seen from the input pad 402 to the output pad 414. The resistor 803 represents the resistance $R_{ATT}$ seen from the input pad 402 to the output pad 414. The capacitor 805 represents the total capacitance $C_M$ imposed by the two compensation capacitors 432, 438. It can be seen from this equivalent circuit that the phase $\emptyset_{ATT\_STATE}$ of the cell 400 during attenuation state is:

$$\emptyset_{ATT_{STATE}} = -\tan^{-1}[R_{ATT} w C_M] \quad \text{Eq. 4}$$

From Eq. 4, it can be seen that increasing the size of $C_M$ makes the phase of the cell 400 more negative during the attenuation state. The phase of the cell 400 during the reference state is more negative than it is during the attenuation state. Therefore, increasing the size of the compensation capacitors 432, 438 reduces the amount of relative phase error in the cell 400. However, has a negative impact on the frequency response, because it moves the pole that is created by the compensation capacitors 432, 438 to compensate for the zero introduced by the off capacitance of the FET 408. That is, in some DSA cells, a pole in the transfer function created by the compensation capacitors helps compensate for a zero introduced by the "off capacitance" of the FET 408 (i.e., the capacitance from source 406 to drain 410). The off capacitance will shunt the resistance of the resistor 418, thus causing less attenuation at higher frequencies. Note that the equivalent circuit of FIG. 8 does not account for the off capacitance of the FET 408, which is not relevant to the analysis of the relative phase error in the attenuation state.

Furthermore, the compensation capacitors 432, 438 are susceptible to process variations. Accordingly, the capacitance of each of the compensation capacitors can vary from one DSA cell 400 to another due to such process variations.

Figure 2:
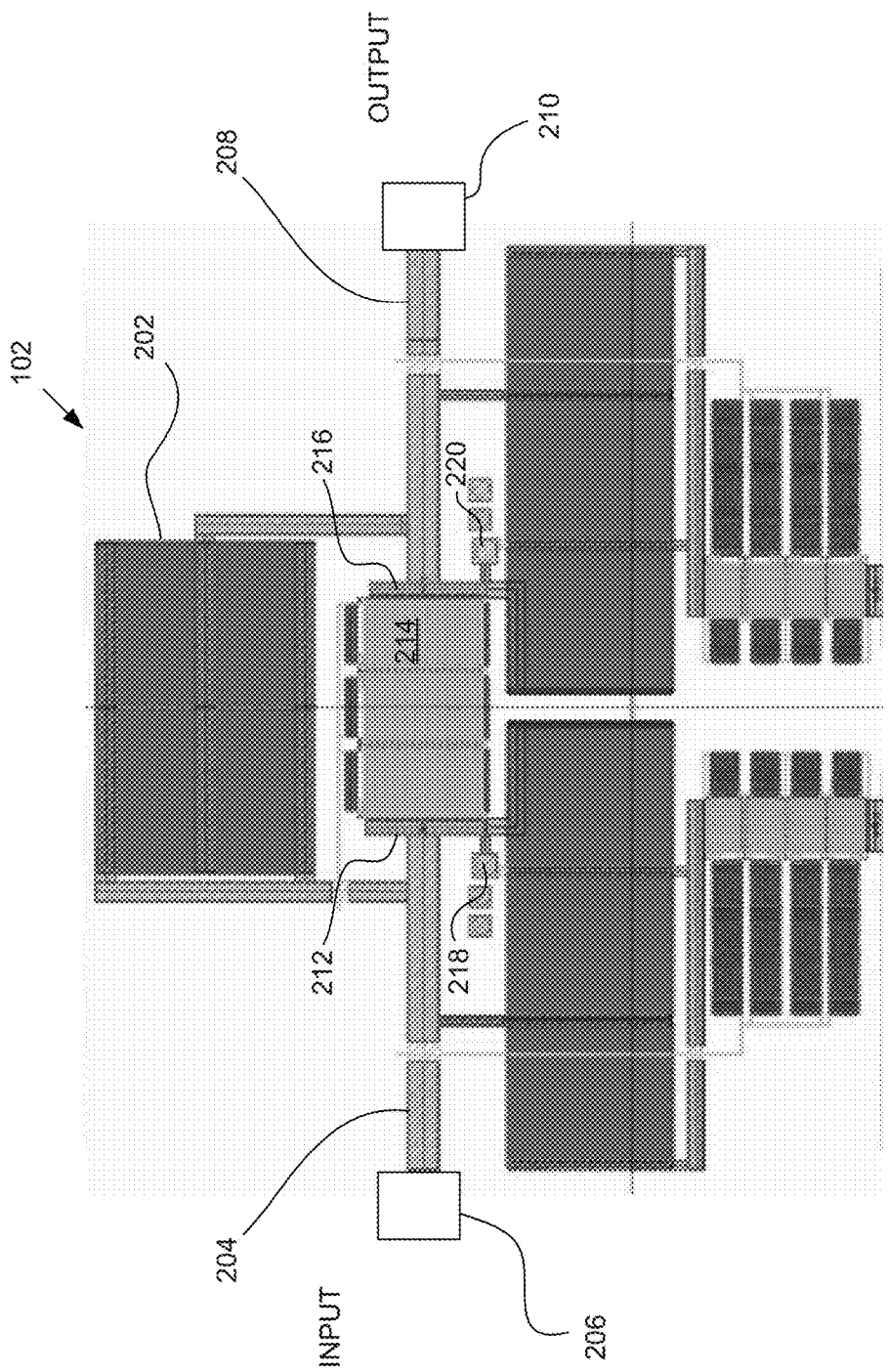
FIG. 2 shows the layout of a typical DSA cell.

In accordance with one embodiment, a reduction in the relative phase error of the cell 400 is achieved by increasing the length of the conductive traces 407, 411. By increasing the length of the conductive traces 407, 411, the compensation capacitors 432, 438 can be decreased from that size that would otherwise be needed. It should be noted that the scale of the layout shown in FIG. 2 and FIG. 4 are different. Therefore, the relative size of the compensation capacitors 432, 438 is not shown by the relative size of the structures shown in FIG. 2 and FIG. 4. Accordingly, the capacitance of one or both of the capacitors 432, 438 is selected together with the length of one or both of the conductive traces 407, 411 to result in a desired relative phase error. In one such embodiment, the relative phase error of a DSA using several DSA cells 400 in series was reduced to less than 2.8 degrees. In some cases in which the DSA is used together with a digital phase shifter, such a reduction in the relative phase error results in the total relative phase error over the full range of the DSA attenuation states being less than the difference in phase represented by a change in the least significant bit of the digital phase shifter.

In striking a balancing between setting the capacitance of the compensation capacitors 432, 438 and increasing the length of the conductive traces 407, 411, the following observations should be noted. Process variations in the fabrication of an integrated circuit can make it difficult to predict the exact reduction in relative phase error that will be attained by increasing the capacitance. In contrast, it is typically easier to predict the amount of reduction achieved by increasing the length of the conductive traces. Therefore, where consistency in the result is more desirable, favoring using longer conductive traces and smaller compensation capacitors may be preferred. The amount of predictability desired may determine the relative reliance on each of the two techniques.

Figure 9:
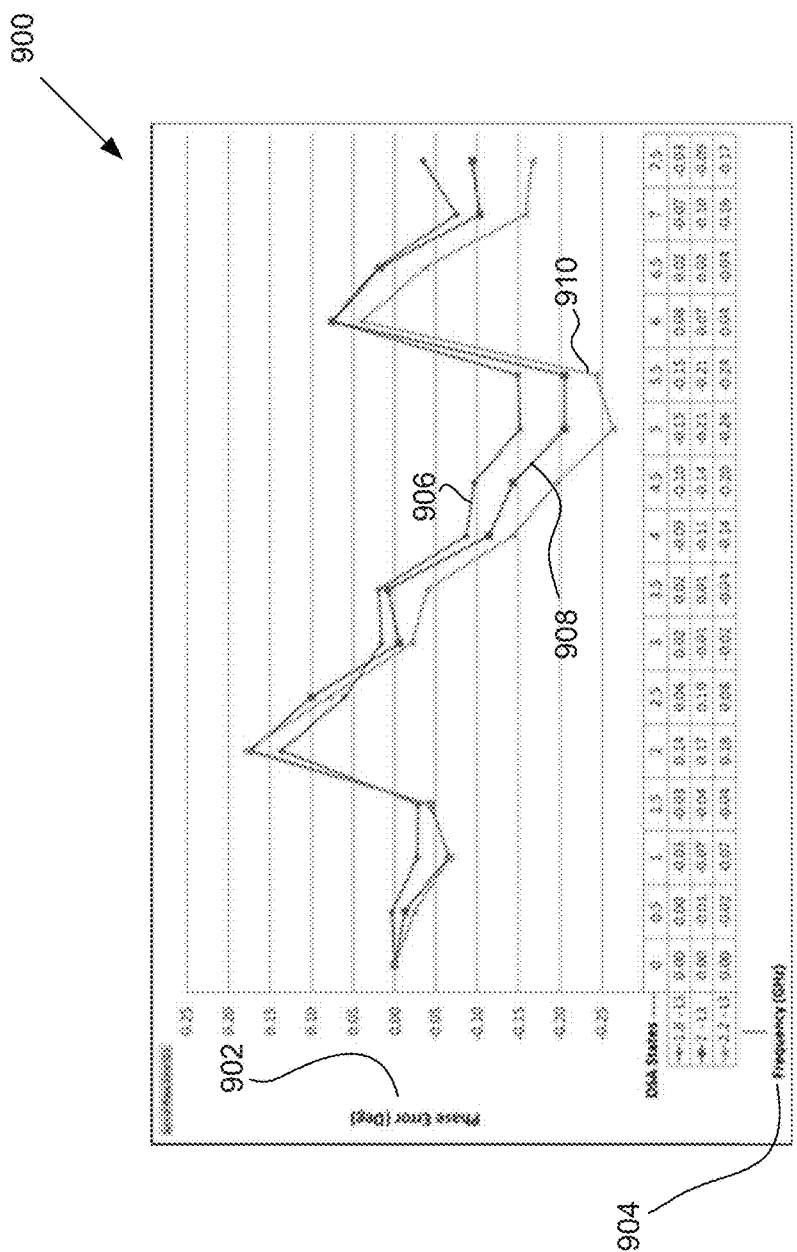
FIG. 9 is a graph of the relative phase error plotted for signals applied to an attenuator that uses a plurality of cells.

FIG. 9 is a graph of the relative phase error plotted for signals applied to an attenuator that uses a plurality of cells 400. The plot 900 shows three curves, each representing a different frequency. A first curve 906 shows the relationship of relative phase error to attenuation for signals input to the attenuator at a frequency of 1.8 GHz. A second curve 908 shows the relationship of relative phase error to attenuation for signals input to the attenuator at a frequency of 2.0 GHz. A third curve 910 shows the relationship of relative phase error to attenuation for signals input to the attenuator at a frequency of 2.2 GHz. The vertical axis 902 of the plot 900 indicates the amount of relative phase error for each value of attenuation plotted along the horizontal axis 904. From the plot 900 it can be seen that the worst case relative phase error of −0.26 degrees occurs at an attenuation of 5 dB and frequency of 2.2 GHz. The difference between the most positive and most negative relative phase error is only 0.18−(−0.26)=0.44 degrees.

Figure 3:
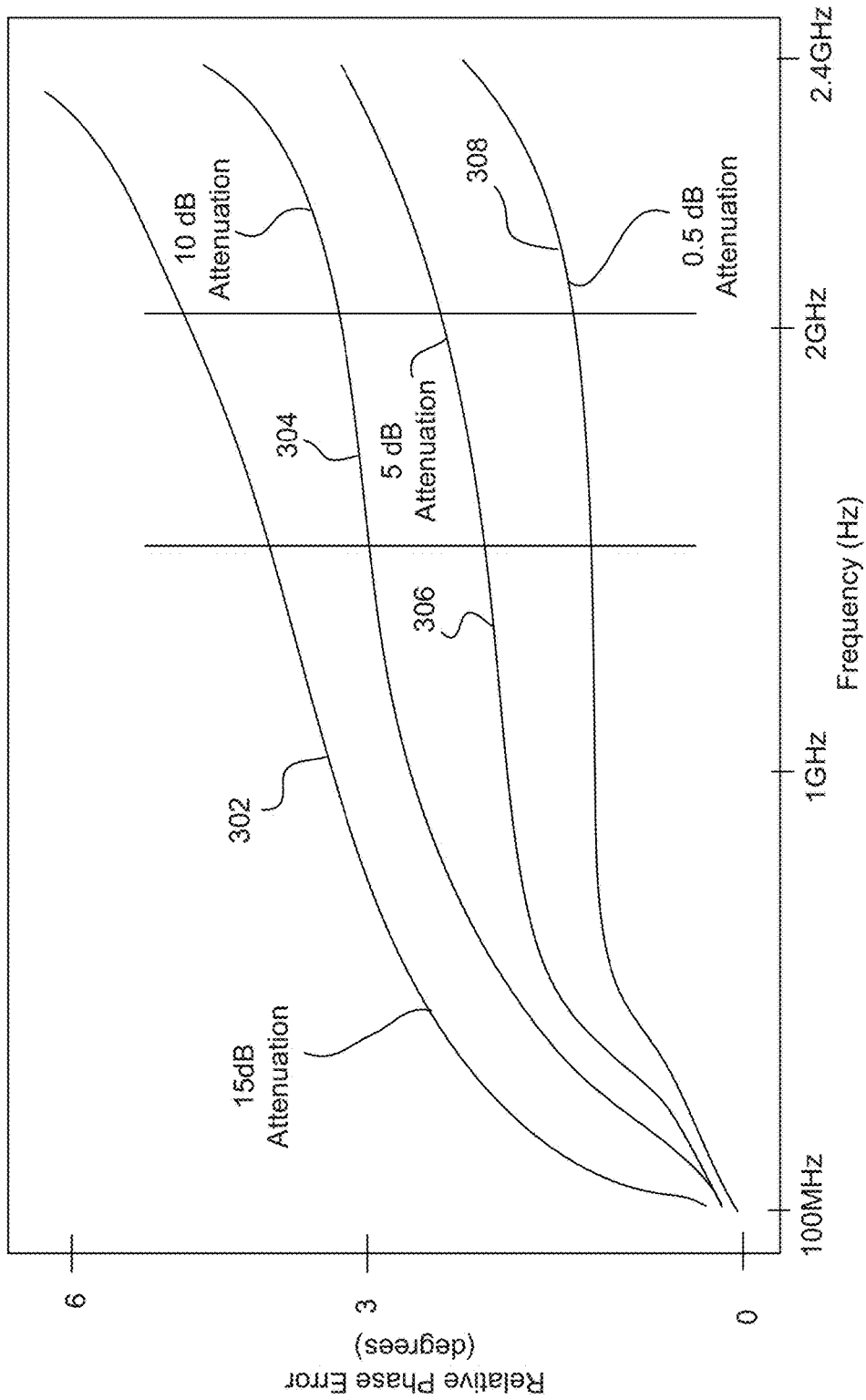
FIG. 3 is a plot that shows relative phase error with respect to frequency for several different attenuation settings of a DSA.

It can be seen that this is a substantial improvement from the relative phase error measured through attenuators that do not employ the disclosed apparatus. That is, the plot 300 shown in FIG. 3 shows that the greatest relative phase error (approximately 5.7 degrees) for a frequency of approximately 2.2 GHz occurs with an attenuation of 15 dB. Furthermore, the difference in relative phase error plotted against frequency (i.e., group delay) over a particular band of interest (1.75 GHz to 2.25 GHz) for an attenuator set for 15 dB of attenuation and which does not use the cells 400 disclosed herein, shows a difference in the relative phase error of approximately 1 degree.

Figure 10:
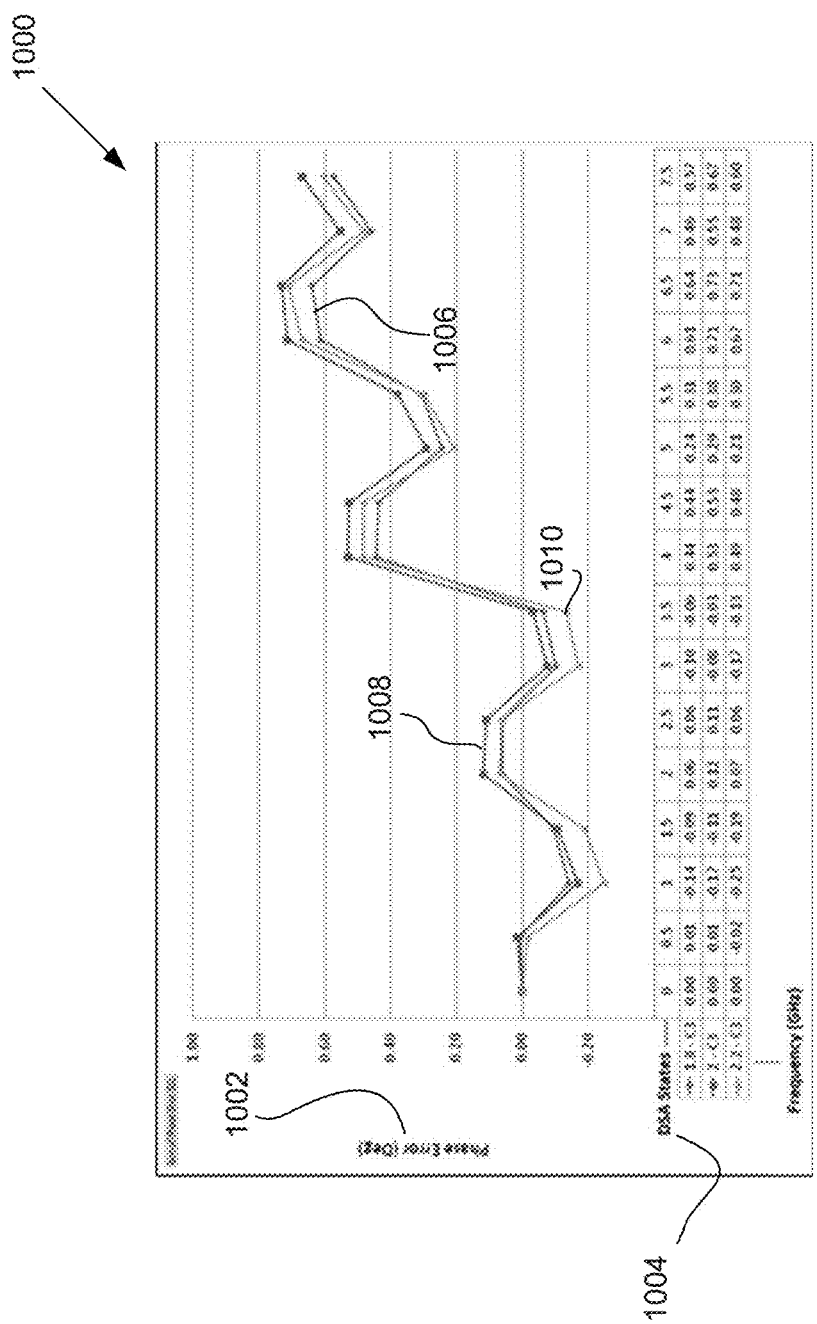
FIG. 10 shows a graph of the relative phase error plotted for signals applied to an attenuator that uses a plurality of cells, in which the size of the compensation capacitors has been adjusted to minimize the relative phase error.

FIG. 10 shows a graph of the relative phase error plotted for signals applied to an attenuator that uses a plurality of cells 400 in which the size of the compensation capacitors has been adjusted to minimize the relative phase error. The plot 1000 shows three curves, each representing a different frequency. A first curve 1006 shows the relationship of relative phase error to attenuation for signals input to the attenuator at a frequency of 1.8 GHz. A second curve 1008 shows the relationship of relative phase error to attenuation for signals input to the attenuator at a frequency of 2.0 GHz. A third curve 1010 the shows the relationship of relative phase error to attenuation for signals input to the attenuator at a frequency of 2.2 GHz. Attenuation (i.e., DSA states) is plotted across the horizontal axis 1004. The vertical axis 1002 of the plot 1000 indicates the amount of relative phase error for each value of attenuation plotted along the horizontal axis 1004.

It should be noted that similar to the case when selecting inductance, there are tradeoffs that need to be taken into consideration when selecting the particular value of capacitance to be provided by the compensation capacitors. Each DSA cell 400 of the DSA will interact with the other cells 400 so that the resulting curve shown in FIG. 10 is not monotonic. As was noted above for the case of selecting inductances, these tradeoffs will be different for different configurations of the DSA.

Due to the differences in the way an attenuator will behave when the cells 400 are combined to form different attenuator architectures, in accordance with one embodiment, the particular value of the inductive coupling and the compensation capacitors will depend upon the implementation. Nonetheless, in accordance with the disclosed embodiments the selection of these values will be driven at least in part by the desire to attain improved relative phase error performance.

The plot 1000 shows that the worst case relative phase error of 0.73 degrees occurs at an attenuation of 6.5 dB for the DSA cell in which the capacitance of the compensation capacitors is set to reduce the relative phase error. The difference between the most positive and most negative relative phase error is only 0.73−(−0.19)=0.92 degrees. It can be seen that this is an even greater improvement than is achieved by adding the inductive coupling of FIGS. 4 and 5.

Figure 11:
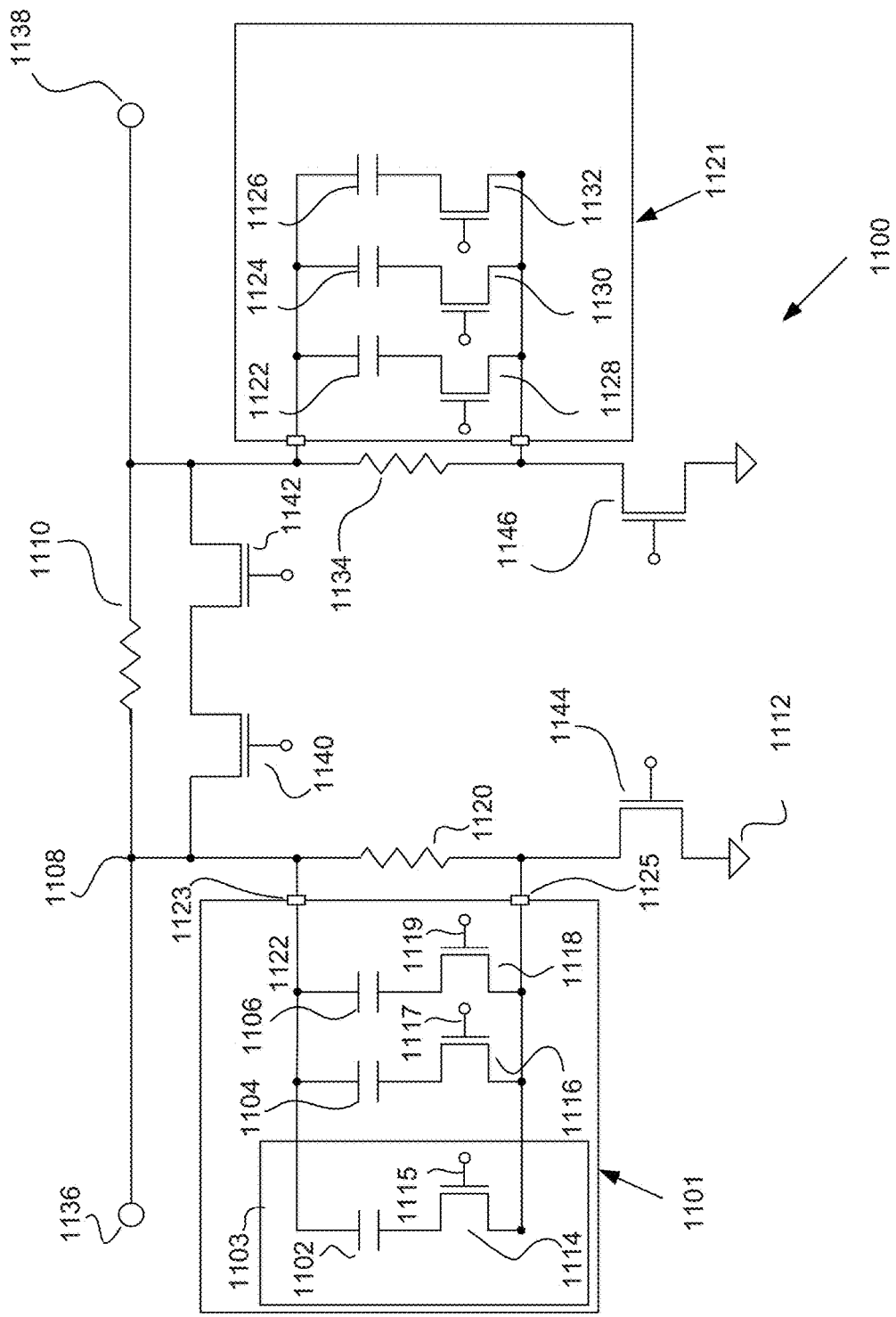
FIG. 11 is an electrical schematic of an alternative embodiment of DSA cell in which one or more capacitors can be selected to be coupled between a first terminal of a resistive element and ground to allow for multiband phase compensation.

FIG. 11 is an electrical schematic of an alternative embodiment of DSA cell 1100 in which two capacitive switching circuits 1101, 1121 allow a user to determine the amount relative phase error compensation capacitance to be used. The capacitive switching circuit 1101 has a first terminal 1123 coupled to an input port 1136 of the DSA cell 1100. The capacitive switching circuit 1101 includes one or more capcitances, such as capacitors 1102, 1104, 1106 that can be selectively coupled between the first terminal 1123 and a second terminal 1125 of the capacitive switching circuit 1101. In the embodiment shown in FIG. 11, there are three such capacitors 1102, 1104, 1106. However, in an alternative embodiment, any number of such capacitors can be provided. Three switches, such as FETs 1114, 1116, 1118, are provided to select which of the capacitors 1102, 1104, 1106 are to be connected in parallel with a shunt resistor 1120. Each capacitor 1102, 1104, 1106 and the switch 1114, 1116, 1118 to which that capacitor is coupled form a series capacitor/switch pair. For example, the capacitor 1102 and the FET 1114 form a series capacitor/switch pair 1103. The shunt resistor 1120 helps establish the input impedance of the DSA cell 1100. Similarly, a shunt resistor 1134 helps establish the output impedance of the DSA cell 1100.

By turning on one or more of the FETs 1114, 1116, 1118, one or more of the associate capacitors 1102, 1104, 1106 will be placed in parallel with the shunt resistor 1120. The ability to control which of the capacitors are to be placed in parallel with the shunt resistor 1120 provides a mechanism by which the frequency response and relative phase error of the DSA cell 1100 can be controlled. In particular, each of the FETs 1114, 1116, 1118 can be controlled to select a desired amount of capacitance to be placed in parallel with the shunt resistor 1120. In one embodiment a control terminal, such as the gate 1115 of the FET 1114 provides a mechanism by which the FET 1114 can be turned on and off. Similarly, the FETs 1116, 1118 are controlled by applying signals to their respective and associated gate 1117, 1119. In one embodiment, the particular selection as to which FETs are to be turned on and off is made based upon the particular frequency of the signals to be attenuated by the DSA cell 1100. In one embodiment of the disclosed apparatus, a similar capacitive switching circuit 1121 includes a set of capacitances, such as capacitors 1122, 1124, 1126 and FETs 1128, 1130, 1132 that are coupled to select the amount of capacitance to be placed in parallel with a second shunt resistor 1134. Having a symmetrical arrangement of capacitors and FETs coupled to the input port 1136 and output port 1138 of the DSA cell provides essentially the same transfer function for signals applied to the attenuator in either direction (i.e., from the input port 1136 to the output port 1138, and from the output port 1138 to the input port 1136).

In the embodiment shown in FIG. 11, the resistive element 1110 is shunted by two parallel FETs 1140, 1142. These two FETs operate essentially in the same manner as the FET 408 shown in FIG. 5. That is, by having both FETs 1140, 1142 turned on (i.e., conducting current with minimal resistance from source to drain), the resistive element 1110 that is in series with the signal path from the DSA cell input 1136 to the DSA cell output 1138 is bypassed to put the DSA cell 1100 in the reference state. The particular configuration of the switch used to bypass the resistive element 1100 in the reference state is not significant. Accordingly, the switch implemented by the FETs 1140, 1142 in FIG. 11 can be implemented in any one of several ways well known to those skilled in the art, including using one or more FETs placed in parallel to one another or one or more FETs serially connected to one another. Likewise, it should be understood that the FET 408 shown in FIG. 5 may be implemented in any one of several ways well known to those skilled in the art, including by using two series FETs, as shown in FIG. 11.

In a manner similar to that noted in the discussion regarding FETs 428, 436 of the circuit shown in FIG. 5, two FETs 1144, 1146 provide a mechanism to remove the impedance matching resistors 1120, 1134, each of the compensation capacitors 1102, 1104, 1106, 1122, 1124, 1126 and each of the associated FETs 1114, 1116, 1118, 1128, 1130, 1132 from the circuit.

Figure 12:
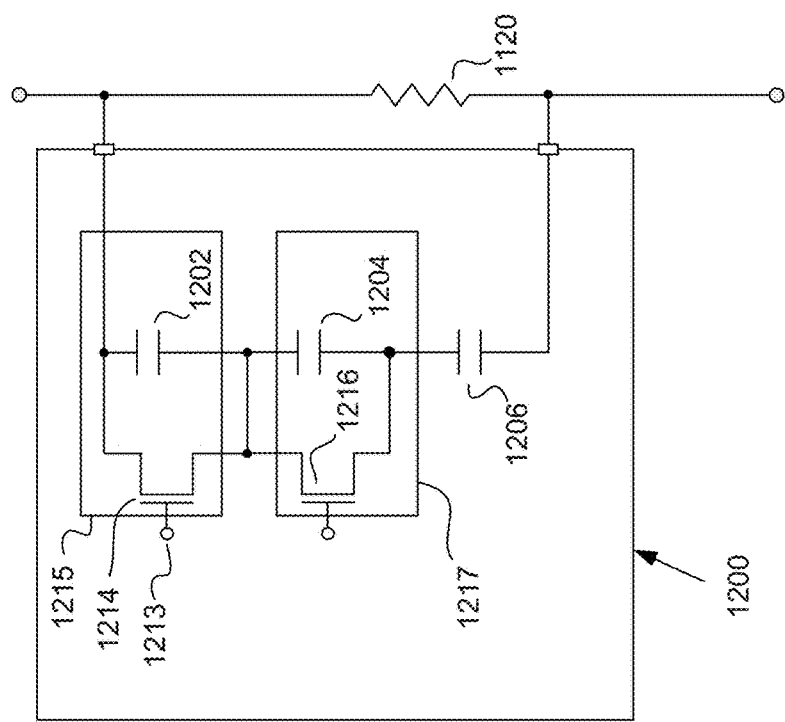
FIG. 12 is a schematic of an alternative capacitive switching circuit in accordance with one embodiment of the disclosed method and apparatus.

FIG. 12 is a schematic of an alternative capacitive switching circuit 1200 in accordance with one embodiment of the disclosed method and apparatus. The circuit 1200 is used in place of the circuit 1101 shown in FIG. 11. The compensation capacitances, such as capacitors 1202, 1204, 1206 of the circuit 1200 are placed in series with one another. A first FET 1214 is in parallel with the first capacitor 1202 forming a first parallel capacitor/switch pair 1215. The gate of the FET 1214 is coupled to a control port 1213 of the parallel capacitor/switch pair 1215. A second parallel capacitor/switch pair 1217 is formed by the capacitor 1204 and FET 1216. Accordingly, by switching on the FET 1214, the capacitor 1202 can be bypassed. Similarly, switching on the second FET 1216 will allow the second capacitor 1204 to be bypassed. Accordingly, by selecting whether one or both of the capacitors 1202, 1204 are to be bypassed, the equivalent capacitance that is placed in parallel with the resistance 1120 can be selected. In one embodiment, the selection is made based upon the frequency of the signals to be applied to the DSA cell 400. For the sake of symmetry, a similar circuit 1200 replaces the capacitive switching circuit shown in FIG. 11.

Figure 13:
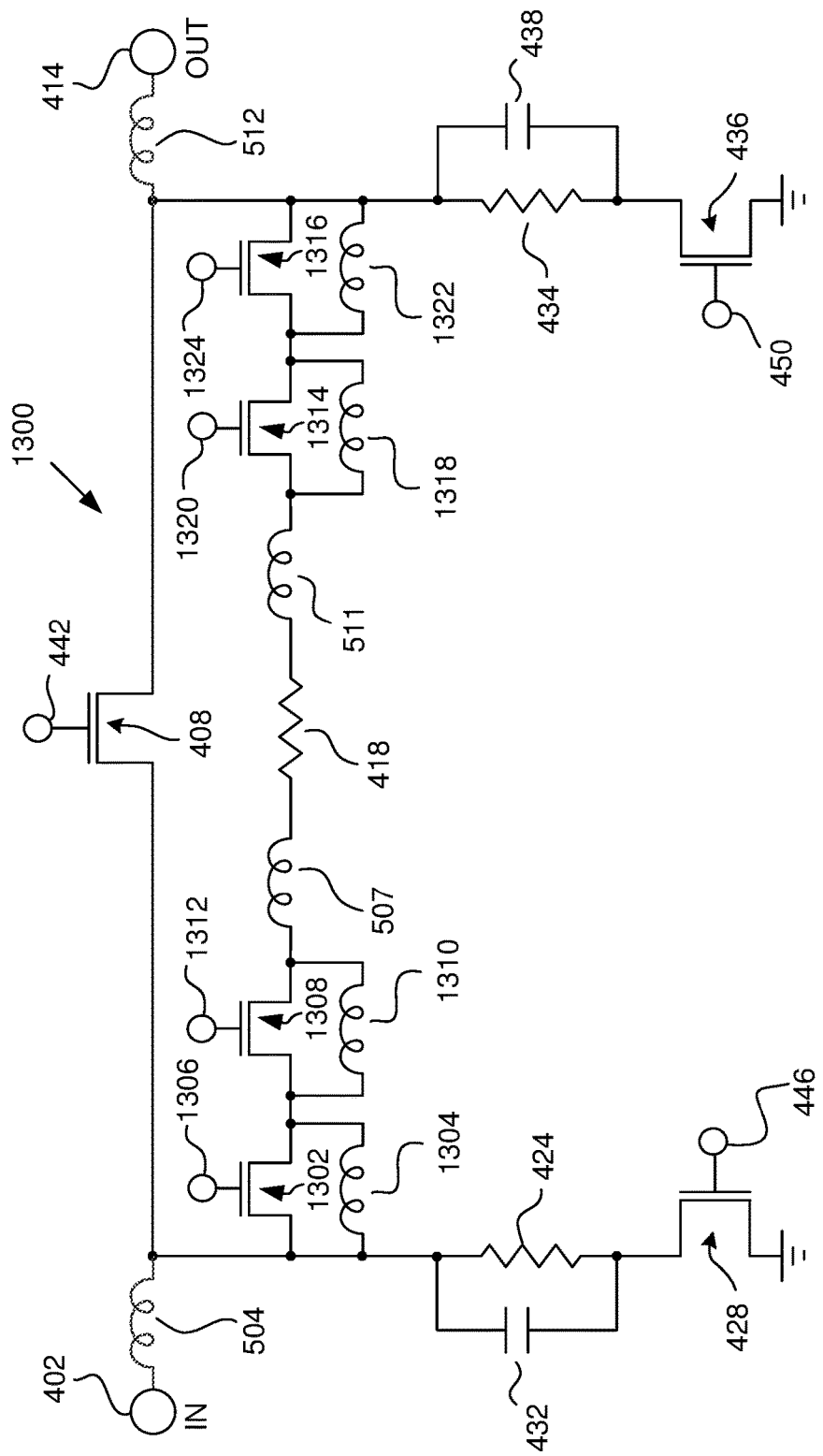
FIG. 13 is a schematic of a DSA cell in accordance with an alternative embodiment in which switches are used to selectively add or bypass inductance to provide appropriate phase compensate in different frequency bands of interest.

FIG. 13 is a schematic of a DSA cell 1300 in accordance with an alternative embodiment in which bypass switches are used to selectively include or bypass additional inductance to provide an appropriate phase compensate circuit in different frequency bands of interest.

A first bypass switch, such as an FET 1302, is placed in series with the resistive element 418. An additional inductance 1304 is placed in parallel with the FET 1302 (i.e., coupled between the source and drain of the FET 1302). The bypass FET 1302 is controlled by a signal applied to a control port 1306. The control port 1306 is coupled to the gate of the bypass FET 1302. Turning the FET 1302 on will essentially short the inductance 1304, removing the inductance from the circuit. A similar configuration is provided by bypass FET 1308, inductance 1310 and control port 1312. The bypass FET 1308 is coupled in series with the first bypass FET 1302. Therefore, by controlling the two bypass FETs 1302, 1308 the amount of inductance that is placed in series between the resistive element 418 and the input port 402 can be controlled. A second two bypass FETs 1314, 1316 are placed in series between the resistive element 418 and the output port 414. An additional inductance 1318 is placed in parallel with the bypass FET 1314. A control port 1320 provides a means by which the bypass FET 1314 can be turned on and off. An additional inductance 1322 is coupled in parallel with the bypass FET 1316. A control port 1324 is coupled to the gate of the bypass FET 1316 to provide a means to control whether the FET 1316 is turned on or off. With all four bypass FETs 1302, 1308, 1314, 1316 turned on, each of the four inductances 1304, 1310, 1318, 1322 are bypassed. Therefore, the combination of the inductances 507, 511 and the capacitances 432, 438 provide phase compensation appropriate for the low frequency band.

When the DSA cell 1300 is to be used in a relatively mid frequency band, the bypass FETs 1302, 1316 are turned off to place the inductances 1304, 1322 into the circuit 1300. In this case, the inductances 1304, 507, 511, 1322 together with the capacitances 432, 438 provide phase compensation appropriate for the mid-frequency band.

When the DSA cell 1300 is to be used in a relatively high frequency band, all four bypass FETs 1302, 1308, 1314, 1316 are turned off to place all four additional inductances 1304, 1310, 1318, 1322 in the circuit. Accordingly, the phase compensation is provided by the combination of the six inductances 1304, 1310, 507, 511, 1318, 1322 and the two shunt capacitances 432, 438.

Accordingly, by controlling which of the bypass FETs 1302, 1308, 1314, 1316 are on and which are off, the user can optimize the DSA cell 1300 to provide the best phase compensation (thus reducing relative phase error) for the particular frequency band in which it is being used. In an alternative embodiment, more or less such compensation circuits can be used to increase or decrease the number of frequency bands that can be selected. For example, by adding additional bypass FETs/additional inductance pairs, the phase compensation can be tailored to a greater number of narrower bands. Likewise, by using only the first two bypass FETs 1302, 1316 and the associated additional inductances 1304, 1322, the user can select from just two frequency bands (i.e., high frequency and low frequency), eliminating the ability to separately compensate for mid frequency band.

Figure 14:
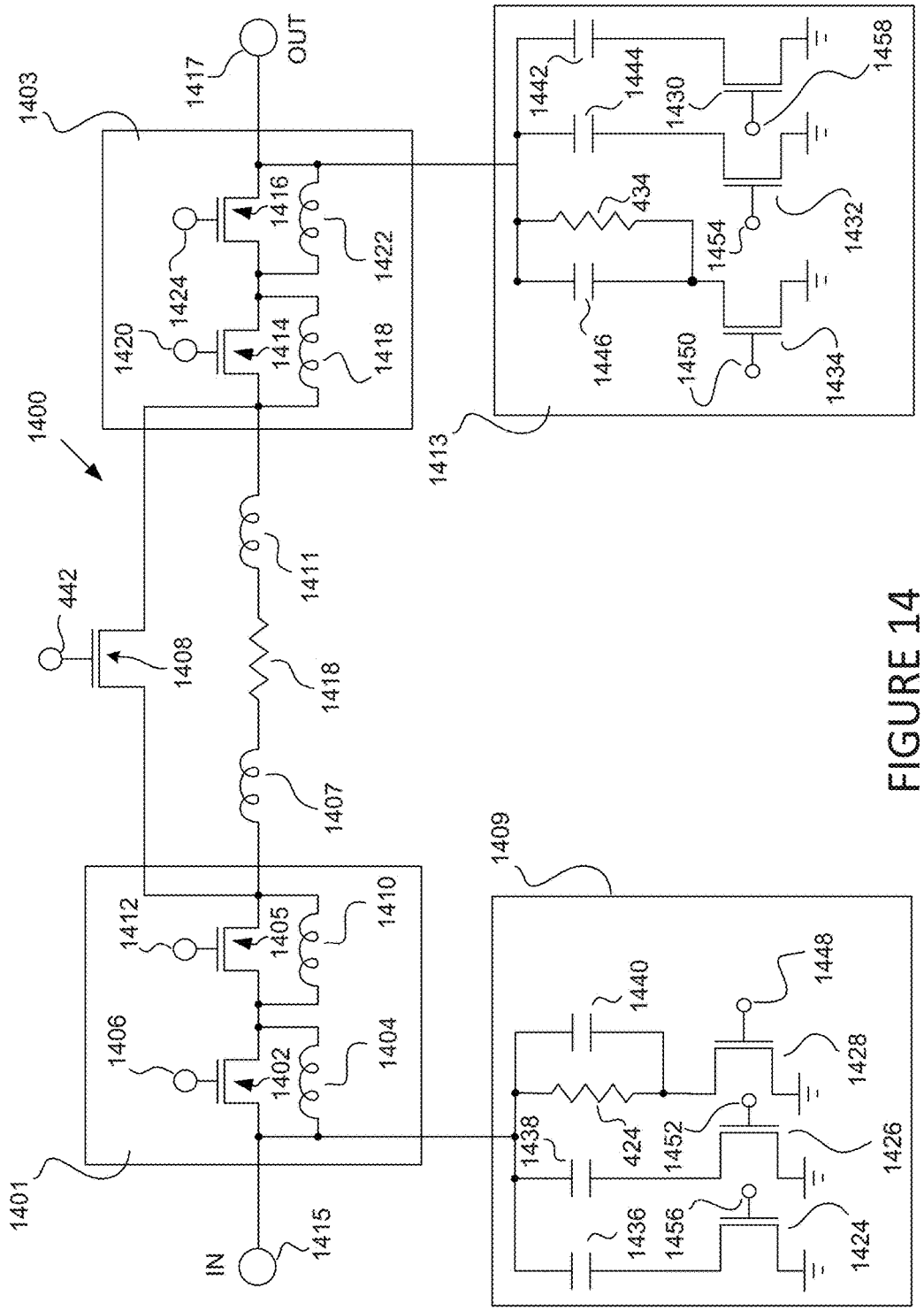
FIG. 14 is a schematic of a DSA cell in accordance with an alternative embodiment of the disclosed method and apparatus in which it is desirable to provide a negative phase shift either in the reference state or the attenuation state.

FIG. 14 is a schematic of a DSA cell 1400 in accordance with an alternative embodiment of the disclosed method and apparatus in which it is desirable to provide a negative phase shift either in the reference state or the attenuation state. The DSA cell 1400 can be modified to provide a positive phase shift as well.

The DSA cell 1400 has two inductance switching circuits 1401, 1403 and two capacitance switching circuits 1409, 1413. The first inductance switching circuit 1401 includes two FETs 1402, 1405 and two relative phase error compensating inductors 1404, 1410. The second inductance switching circuit 1403 includes another two FETs 1414, 1416 and another two relative phase error compensating inductors 1418, 1422. Each FET 1402, 1405, 1414, 1416 controls whether an associated relative phase error compensating inductor 1404, 1410, 1418, 1422 is bypassed.

In addition, two capacitive switching circuits 1409, 1413 provide a selected amount of capacitance to be coupled from the input port 1415 to ground and from the output port 1417 to ground. The first capacitive switching circuit includes three FETs 1424, 1426, 1428 that control the amount of capacitance to be coupled from the input 1415 to ground. Three relative phase error compensating capacitances, such as capacitors 1436, 1438, 1440 are either coupled to ground or not, depending upon the state of the three FETs 1424, 1426, 1428. The second capacitive switching circuit includes another three FETs 1430, 1432, 1434. The FETs are configured to allow the three associated relative phase error compensating capacitors 1442, 1444, 1446 to be coupled to ground when the associated FET is turned on. By selecting which of the inductors 1404, 1410, 1418, 1422 are bypassed and which of the capacitors 1436, 1438, 1440, 1442, 1444, 1446 are coupled to ground, the amount of relative phase error compensation can be selected. In some cases, it may be desirable to provide a negative phase shift to the signals that are passed through the DSA cell in either the attenuation state or the reference state. Alternatively, the values of the inductances 1404, 1410, 1418, 1422 and capacitances 1436, 1438, 1440, 1442, 1444, 1446 are selected to allow the user to add a positive phase shift to the signals that pass through the DSA cell 1400.

In accordance with one embodiment of the DSA cell 1400, the FET 1408 is controlled by a signal $B_0$ applied to the control input port 442. The FETs 1428, 1434 are controlled by a signal $B_0\_B$ that is the inverse of the signal $B_0$. The signal $B_0\_B$ is applied to the control input ports 1448, 1450 associated with the FETs 1428, 1434. Therefore, when the FET 1408 is turned on (the DSA cell 1400 is in the reference state), the FETs 1428, 1434 are turned off, essentially removing the influence of the two capacitors 1440, 1446 associated with the FETs 1428, 1434. When the signal $B_0$ turns the FET 1408 off (in the attenuation state), the FETs 1428, 1434 are turned on and the influence of the two capacitors 1440, 1446 is added to the circuit. With the other FETs 1424, 1426, 1430, 1432 off, the combination of the capacitors 1440, 1446 and inductors 1407, 1411 shifts the phase of signals attenuated by the DSA cell 1400 in the attenuation state to provide a minimal relative phase error. In one embodiment, the relative phase error can be essentially made equal to zero.

The FETs 1402, 1416 are controlled by a signal $B_1$ applied to the control input ports 1406, 1424. The FETs 1426, 1432 are controlled by a signal $B_1\_B$ that is the inverse of the signal $B_1$. The signal $B_1\_B$ is applied to the control ports 1452, 1454 associated with the FETs 1426, 1432. The FETs 1405, 1414 are controlled by a signal $B_2$ coupled to the associated control ports 1412, 1420. The FETs 1424, 1430 are controlled by a signal $B_2\_B$ that is the inverse of the signal $B_2$ applied to the associated control ports 1456, 1458. The state of each of the control signals $B_1$ and $B_2$ is independent of whether the DSA cell 1400 is in the reference state or the attenuation state. The control signals $B_1$ and $B_2$ determine the amount of phase shift applied to the signals by introducing the associated inductances 1404, 1410, 1418, 1422 or alternatively the associated capacitances 1436, 1438, 1440, 1442, 1444, 1446. In accordance with one embodiment of the disclosed method and apparatus, turning on the FETs 1424, 1426, 1430, 1432 and turning off FETs 1402, 1405, 1414, 1416 all each of the associated capacitances and inductances to contribute to a negative phase shift of the signals passed through the DSA cell 1400. Alternatively, each of the FETs 1408, 1402, 1405, 1414, 1416, 1424, 1426, 1428, 1430, 1432, 1434 can be controlled independently to determine the amount of phase compensation to be applied.

Figure 15:
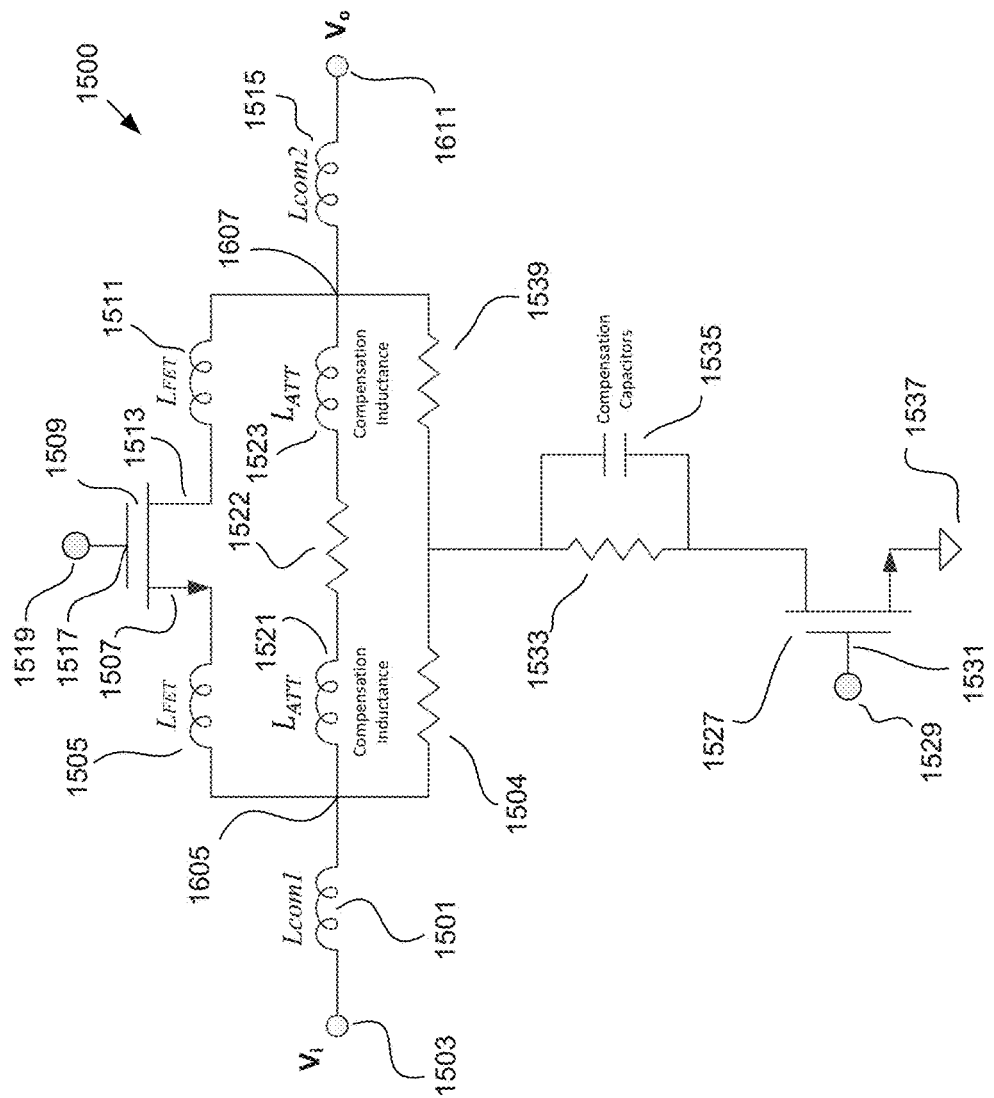
FIG. 15 is a schematic of a DSA cell in accordance with an alternative embodiment of the disclosed method and apparatus in which a bridge T-Attenuator configuration is used to implement the DSA cell.
Figure 16:
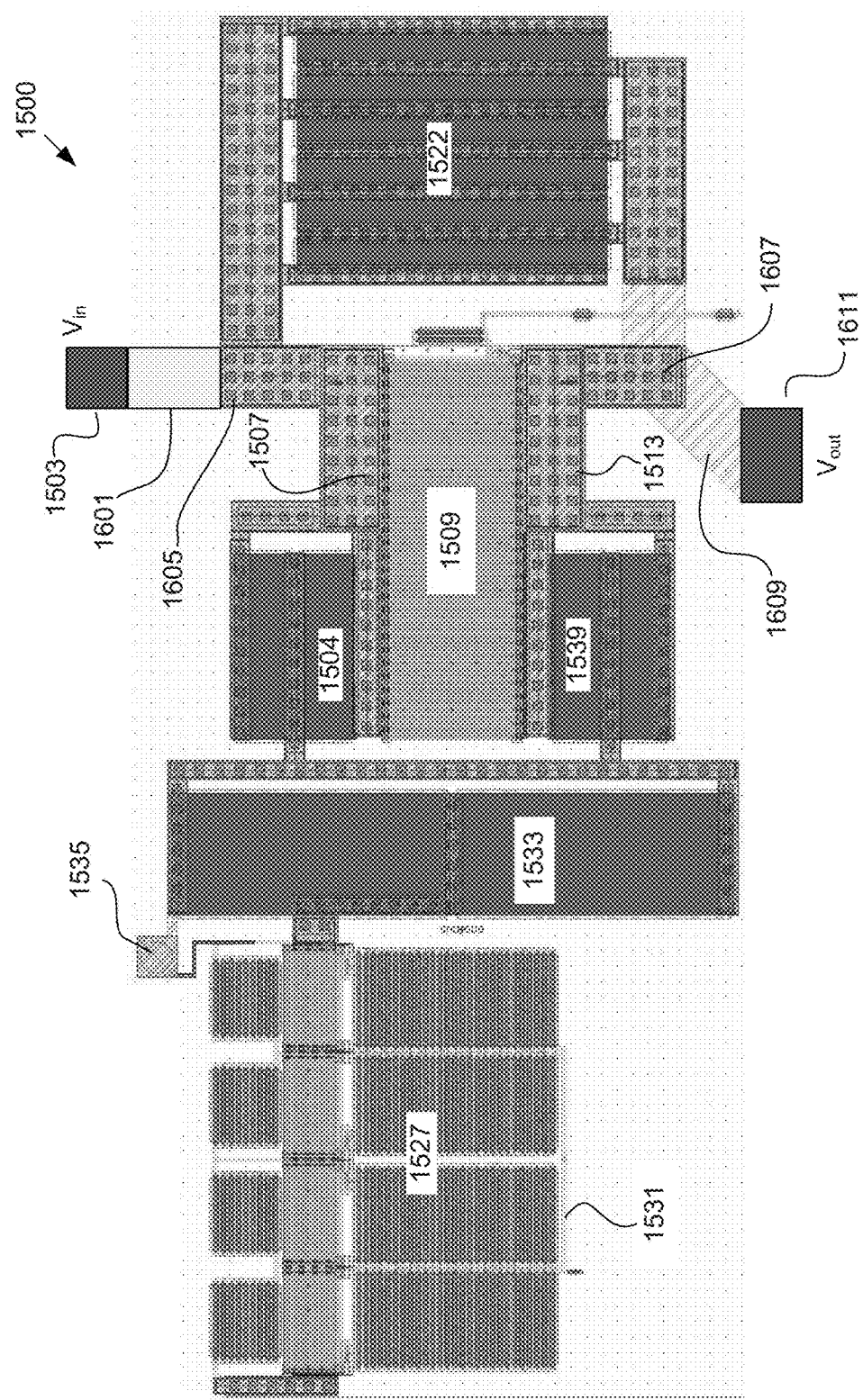
FIG. 16 shows an IC layout of the DSA cell of FIG. 15.

FIG. 15 is a schematic of a DSA cell 1500 in accordance with an alternative embodiment of the disclosed method and apparatus in which a bridge T-Attenuator configuration is used to implement the DSA cell 1500. FIG. 16 shows an IC layout of the DSA cell 1500. A lumped element equivalent of the inductance $L_{com1}$ 1501 represents the common inductance that exists due to the conductive trace 1601 between the input $V_i$ 1503 and a convergence point 1605. The convergence point 1605 is the point at which the traces from the input $V_i$ 1503, a resistor 1504 and the drain of the FET 1507 converge. A lumped element equivalent inductance $L_{FET}$ 1505 represents the inductance that exists between the convergence point 1605 and the drain 1507 of a FET 1509, including any inductance contributed by the structure of the FET 1509.

Similarly, a lumped element equivalent inductance $L_{FET}$ 1511 represents the inductance that exists between the source 1513 of the FET 1509 and a convergence point 1607. A lumped element inductance $L_{com2}$ 1515 represents the inductance of the trace 1609 between the output $V_o$ 1611 and the convergence point 1607. The gate 1517 of the FET 1509 is coupled to a control input port 1519.

When a control signal is coupled to the control input port 1519 to turn the FET 1509 on, the resistance between the input port 1503 and the output port 1611 is minimal. The inductance from input to output is the combination of the inductance through the $L_{com1}$ 1501, $L_{FET1}$ 1505, $L_{FET2}$ 1511 and $L_{COM2}$ 1515.

When a signal applied to the control input port 1519 turns the FET 1509 off, a resistor 1522 that is in series between the input $V_i$ 1503 and the output $V_o$ 1611 essentially establishes the resistance between the input $V_i$ 1503 and the output $V_o$ 1611. The total inductance from the input $V_i$ 1503 and the output $V_o$ 1611 is the sum of the impedance of $L_{com1}$ 1501, $L_{ATT1}$ 1521, $L_{ATT2}$ 1523 and $L_{COM2}$ 1525.

When the FET 1509 is off, a second FET 1527 is turned on by a signal applied to a control input port 1529 coupled to the gate 1531 of the second FET 1527. A resistor 1533 and a parallel capacitor 1535 are then coupled to a common potential 1537 (such as ground) through the FET 1527. In accordance with one embodiment, the capacitor 1535 has a capacitance of 47 fF. Accordingly, the input impedance is established by the path from the input port $V_i$ to the common potential 1537 through the inductance $L_{com1}$, the resistor 1504, and the resistor 1533 in parallel with the capacitor 1535. The output impedance is established by the path from the output port $V_o$ to the common potential 1537 through the inductance $L_{com2}$ 1515, the resistor 1539, and the resistor 1533 in parallel with the capacitor 1535.

It can be seen that the relative phase error of the signals that pass from the input $V_i$ 1503 to the output $V_o$ 1611 can be adjusted to a minimum value by setting the values of the compensation inductances $L_{ATT1}$ 1521, $L_{ATT2}$ 1523 and the compensation capacitor 1535.

Figure 17:
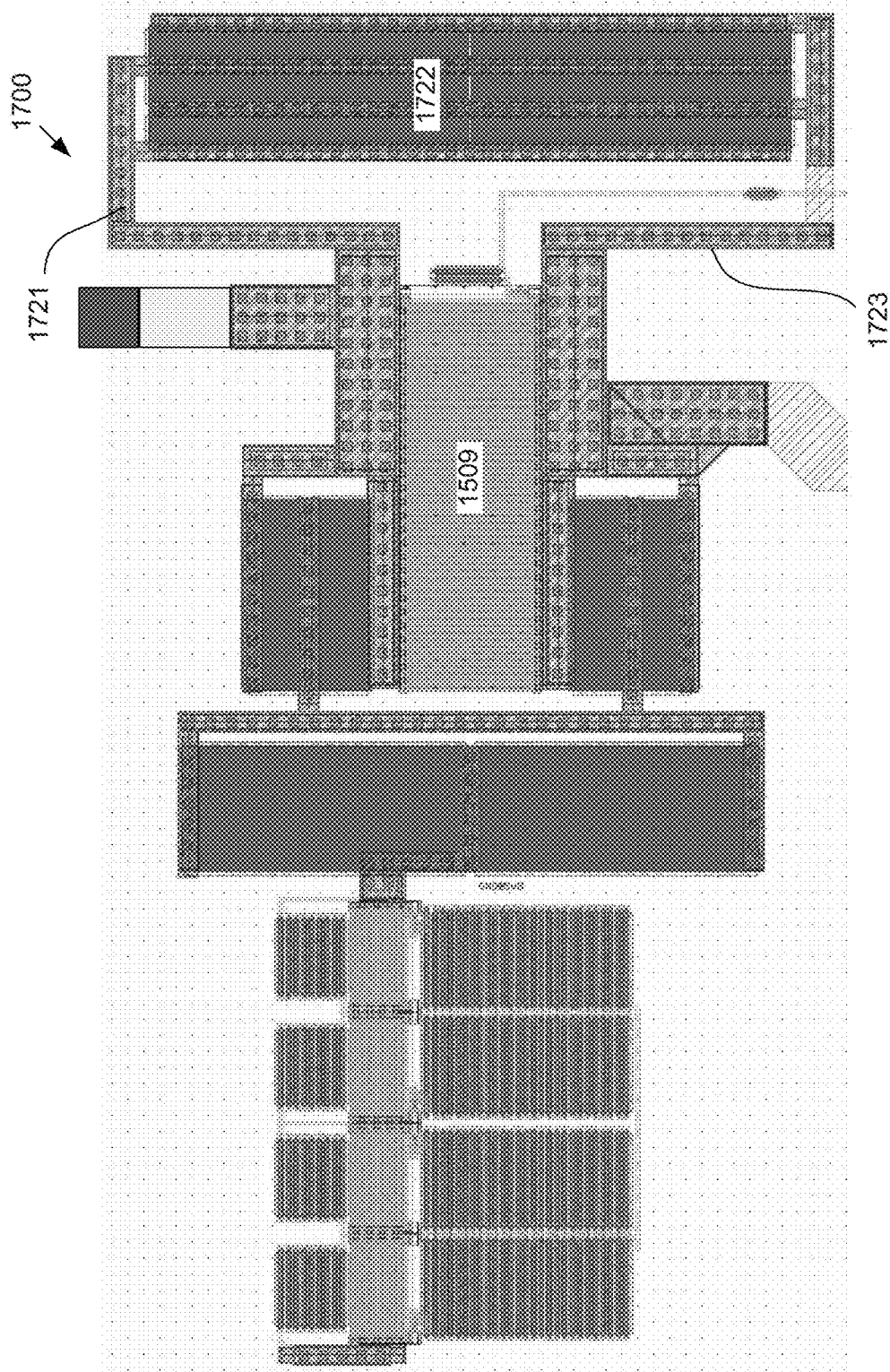
FIG. 17 shows the IC layout for an alternative embodiment of the bridged T-attenuator configuration for use in a DSA cell.

FIG. 17 shows the IC layout for an alternative embodiment of the bridged T-attenuator configuration for use in a DSA cell 1700. In the DSA cell 1700, the layout of the resistor 1722 is different from that of the resistor 1522 of the DSA cell 1500. This allows the traces 1721, 1723 that couple the resistor 1722 to the FET 1509 to be extended to provide additional inductance. Accordingly, the compensation capacitor 1535 used in the DSA cell 1500 can be eliminated in the DSA cell 1700.

Figure 18:
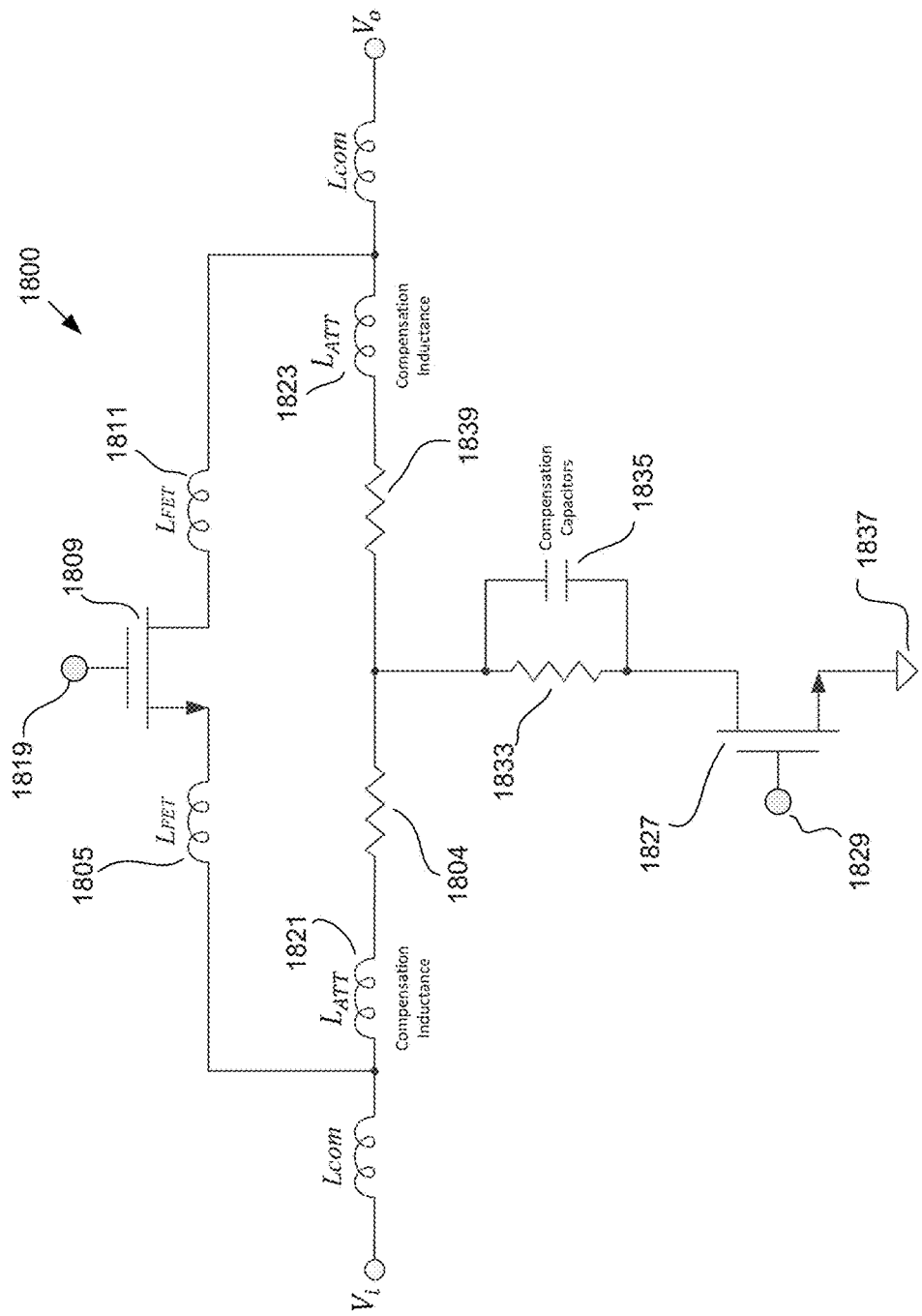
FIG. 18 is a schematic of another embodiment of a DSA cell in which the attenuator is configured as a T-attenuator.

FIG. 18 is a schematic of another embodiment of a DSA cell 1800 in which the attenuator is configured as a T-attenuator.

An FET 1809 controls the amount of attenuation between the input $V_i$ and the output $V_o$ of the DSA cell 1800. A control port 1819 allows a control signal to turn the FET 1809 on and off. When the FET 1809 is on, the resistance between the input $V_i$ and output $V_o$ is minimal, since the FET 1809 will shunt the attenuator resistors 1804, 1839. In addition, when the FET 1809 is turned on, a second FET 1827 is turned off A control signal is applied to a control port 1829 coupled to the gate of the FET 1827 to turn the FET 1827 on or off. When the FET 1827 is off, a shunt resistor 1833 and parallel compensation capacitor 1835 are essentially disconnected from the circuit. That is, the FET 1827 places a very high impedance in the path from the shunt resistor 1833 and parallel compensation capacitor 1835 to the common potential 1837. As is the case in the DSA cell 1500, inductances 1805, 1811 model the inductance of the FET 1809 and the traces leading to the FET 1809. The compensation inductances 1821, 1823 provide the necessary inductance to reduce the relative phase error of the DSA cell 1800.

Figure 19:
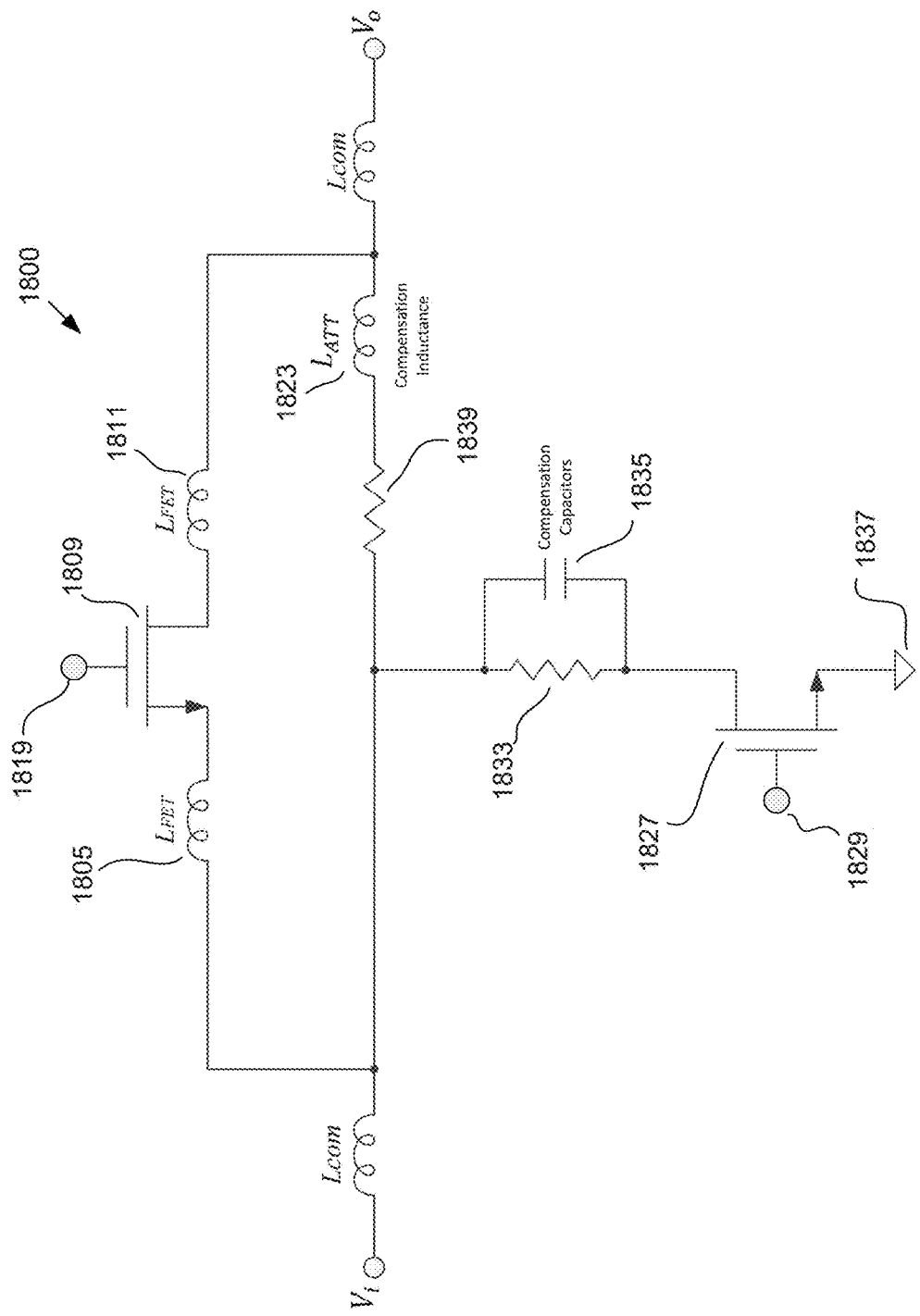
FIG. 19 is a schematic of another embodiment of a DSA cell in which the attenuator is configured as an L-attenuator.

FIG. 19 is a schematic of another alternative embodiment in which the DSA cell is configured as an L-attenuator. One compensation inductance 1823 and one attenuation resistor 1839 are provided. That is, the compensation inductance 1821 is replaced with a short and the attenuation resistor 1804 is replaced with a short. Alternatively, the inductance 1823 and resistor 1839 can be removed and replaced with a short, leaving inductance 1821 and resistor 1804 to provide the necessary inductance and resistance when the FET 1809 is turned off. In addition, increasing the compensation inductance 1821, 1823 may provide sufficient phase compensation to eliminate the need for the compensation capacitor 1835 (i.e., the relative phase error can be reduced sufficient by increasing the compensation inductance 1821, 1823).

Although the disclosed method and apparatus is described above in terms of various examples of embodiments and implementations, it should be understood that the particular features, aspects and functionality described in one or more of the individual embodiments are not limited in their applicability to the particular embodiment with which they are described. Thus, the breadth and scope of the claimed invention should not be limited by any of the examples provided in describing the above disclosed embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide examples of instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described with the aid of block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A digital step attenuator (DSA) cell comprising:
   a) an input port;
   b) an output port;
   c) a first control input port;
   d) a first resistive element having a first end and a second end;

e) a first switch element having an input, an output and a control, the input being coupled to the input port and the output being coupled to the output port and the control being coupled to the first control input port;

f) a first inductive coupling having an inductance and a first end and a second end, the first end coupled to the input port, the second end coupled to the first end of the first resistive element;

g) a second inductive coupling having an inductance and a first end and a second end, the first end of the second inductive coupling coupled to the output port and the second end of the second inductive coupling coupled to the second end of the first resistive element;

wherein the inductances of the first and second inductive couplings are selected to result in a reduction in the difference in relative phase in the signal output by the DSA cell respect to the signal applied to the input of the DSA cell from the difference that would present in the output signal were the inductances not presented.

2. The DSA cell of claim 1, further comprising:
a) a first capacitor having a first and second end, the first end coupled to the input of the first switch element;
b) a second switch element having an input and output and a control, the input of the second switch element being coupled to the second end of the first capacitor, the output of the second switch element being coupled to ground;
c) a second capacitor having a first and second end, the first end coupled to the output of the first switch element;
d) a third switch element having an input, an output and a control, the input being coupled to the second end of the second capacitor, the output being coupled to ground;

wherein the control of the second switch element provides a means by which the second switch element can be turned on and off; and
wherein the control of the third switch element provides a means by which the third switch element can be turned on and off.

3. The DSA cell of claim 1, further comprising:
a) a second resistive element having a first and second end, the first end of the second resistive element coupled to the input of the first switch element;
b) a third resistive element having a first and second end, the first end of the third resistive element coupled to the output of the first switch element;
c) a second switch element, the second switch element having an input, an output and a control, the input coupled to the second end of the third resistive element and the output coupled to a common potential; and
d) a second control input port coupled to the control of the second switch element.

4. The DSA cell of claim 3, further comprising a capacitor having a first and second end, the first end coupled to the first end of the third resistive element and the second end of the capacitor coupled to the second end of the third resistive element, wherein the capacitance of the capacitor is selected to allow a reduction in the size of the inductive coupling to be smaller without increasing the relative phase error of the DSA cell.

5. The DSA cell of claim 4, further including a fourth resistive element having a first and second end, the first end of the fourth resistive element coupled between the second end of the second resistive element and the input of the second switch element.

6. The DSA cell of claim 3, further including a fourth resistive element having a first and second end, the first end of the fourth resistive element coupled between the second end of the second resistive element and the input of the second switch element.

7. The DSA cell of claim 6, further including a capacitor having a first and second end, the first end of the capacitor coupled to the first end of the fourth resistive element and the second end of the capacitor coupled to the second end of the fourth resistive element, wherein the inductance of the first and second inductive couplings are reduced due to the capacitance without substantially increasing the relative phase error of the DSA cell.

8. The DSA cell of claim 1, further including:
a) a first additional inductance coupled between the first end of the first resistive element and the input port; and
b) at least one first bypass switch for selectively bypassing at least a portion of the first additional inductance.

9. The DSA cell of claim 8, further including:
a) a second additional inductance coupled between the second end of the first resistive element and the output port; and
b) at least one second bypass switch selectively bypassing at least a portion of the second additional inductance.

10. The DSA cell of claim 1, wherein the first switch element is a first field effect transistor (FET), the input to the first switch element is the drain of the first FET, the output of the first switch element is the source of the first FET further and the control of the first switch element is the gate of the first FET, the DSA cell further including:
a) at least one second control input port; and
b) a capacitive switching circuit including:
  i. an input coupled to the source of the first FET;
  ii. an output coupled to ground; and
  iii. at least one control coupled to the second control input port of the DSA cell.

11. The DSA cell of claim 10, further including a second resistive element having a first and a second end, the first end of the second resistive element coupled to the input of the capacitive switching circuit and the second end of the second resistive element coupled to the output of the capacitive switching circuit.

12. The DSA cell of claim 10, the capacitive switching circuit further including at least one series capacitance/switch pair, each series capacitive/switch pair having an input and an output, the input of each series capacitive/switch pair coupled to the input of the capacitive switching circuit and each output of each series capacitive/switch pair coupled to the output of the capacitive switching circuit.

13. The DSA cell of claim 10, the capacitive switching circuit further including:
a) at least one control port;
b) at least one parallel capacitance/switch pair having an input, an output and a control, each of the at least one parallel capacitance/switch pairs coupled together in a series string, the control of each parallel capacitance/switch pair coupled to a corresponding one of the control ports of the capacitive switching circuit, the input of the first parallel capacitance/switch pair of the series string being coupled to the input of the capacitive switching circuit; and
c) a capacitor having a first and second end, the first end of the capacitor being coupled to the output of the last parallel capacitance/switch pair of the series string and the second end of the capacitor being coupled to the second end of the first resistive element and to the output of the capacitive switching circuit.

14. A Digital Step Attenuator (DSA) including:
a) a first DSA cell as recited in claim 1; and
b) a second DSA cell as recited in claim 1, the output port of the second DSA cell coupled to the input port of the first DSA cell.

15. The DSA of claim 14, wherein each of the DSA cells further includes:
a) a first additional inductance coupled between the first end of the first resistive element and the input port; and
b) at least one first bypass switch for selectively bypassing at least a portion of the first additional inductance.

16. The DSA of claim 15, wherein each of the DSA cells further includes:
a) a second additional inductance coupled between the second end of the first resistive element and the output port; and
b) at least one second bypass switch selectively bypassing at least a portion of the second additional inductance.

17. The DSA of claim 14, wherein each DSA cell further includes:
a) a second resistive element having a first and second end, the first end of the second resistive element coupled to the first end of the first resistive element;
b) a third resistive element having a first and second end, the first end of the third resistive element coupled to the first end of the first resistive element;
c) a second switch element, the second switch element having an input, an output and a control, the input coupled to the second end of the third resistive element and the output coupled to a common potential; and
d) a second control port coupled to the control of the second switch element.

18. The DSA of claim 14, wherein the DSA cell further includes:
a) at least one second control input port; and
b) a capacitive switching circuit including;
 i. an input coupled to the source of the first FET;
 ii. an output coupled to ground; and
 iii. at least one control coupled to the second control input port of the DSA cell.

19. The DSA of claim 18, wherein each of the DSA cells further includes a second resistive element having a first and a second end, the first end of the second resistive element coupled to the input of the capacitive switching circuit and the second end of the second resistive element coupled to the output of the capacitive switching circuit.

20. The DSA of claim 18, wherein the capacitive switching circuit of each of the DSA cells further includes at least one series capacitance/switch pair, each series capacitive/switch pair having an input and an output, the input of each series capacitive/switch pair coupled to the input of the capacitive switching circuit and each output of each series capacitive/switch pair coupled to the output of the capacitive switching circuit.

21. The DSA of claim 14, wherein each DSA cell further includes:
a) a second resistive element having a first and second end, the first end of the second resistive element coupled to the first end of the inductive coupling;
b) a third resistive element having a first and second end, the first end of the third resistive element coupled to the first end of the second inductive coupling;
c) a fourth resistive element having a first and second end, the first end of the fourth resistive element coupled to the second end of the second resistive element and to the second end of the third resistive element;
d) a second switch element, the second switch element having an input, an output and a control, the input coupled to the second end of the fourth resistive element and the output coupled to a common potential; and
a second control port coupled to the control of the second switch element.

* * * * *